(12) United States Patent
Gomez

(10) Patent No.: US 7,177,143 B1
(45) Date of Patent: Feb. 13, 2007

(54) MOLDED ELECTRONIC COMPONENTS

(75) Inventor: Leonardo Gomez, Oxford, AL (US)

(73) Assignee: Communication Associates, Inc., Anniston, AL (US)

( * ) Notice: Subject to any disclaimer, the term of this patent is extended or adjusted under 35 U.S.C. 154(b) by 52 days.

(21) Appl. No.: 11/033,931

(22) Filed: Jan. 11, 2005

Related U.S. Application Data

(63) Continuation-in-part of application No. 10/636,066, filed on Aug. 4, 2003.

(60) Provisional application No. 60/401,133, filed on Aug. 5, 2002.

(51) Int. Cl.
*G06F 1/16* (2006.01)
*H04B 7/185* (2006.01)

(52) U.S. Cl. .................... 361/679; 455/12.1; 174/52.1; 257/724

(58) Field of Classification Search ................ 375/232; 455/12.1; 361/679–687, 723–728, 757; 174/52.1–52.4; 257/415, 724, 659, 687; 29/843, 845
See application file for complete search history.

(56) References Cited

U.S. PATENT DOCUMENTS

| | | | |
|---|---|---|---|
| 3,654,695 A | 4/1972 | Del Gaudio | |
| 4,600,969 A | 7/1986 | Hendrickson | |
| 4,707,763 A | 11/1987 | Kudo | |
| 5,059,746 A | 10/1991 | Hayes et al. | |
| 5,294,749 A | 3/1994 | Lauder et al. | |
| 5,319,522 A | 6/1994 | Mehta | |
| 5,382,829 A | 1/1995 | Inoue | |
| 5,448,825 A | 9/1995 | Lee et al. | |
| 5,475,379 A | 12/1995 | George et al. | |
| 5,533,665 A | 7/1996 | Sinclair et al. | |
| 5,570,272 A | 10/1996 | Variot | |
| 5,617,297 A | 4/1997 | Lo et al. | |
| 5,715,594 A | 2/1998 | Patterson et al. | |
| 5,827,999 A | 10/1998 | McMillan et al. | |
| 5,864,178 A | 1/1999 | Yamada et al. | |
| 5,909,915 A | 6/1999 | Okuda | |
| 6,030,684 A | 2/2000 | Polak et al. | |
| 6,150,905 A | 11/2000 | Nishijima | |
| 6,224,810 B1 | 5/2001 | Tsutsumi | |
| 6,233,817 B1 | 5/2001 | Ellis et al. | |
| 6,381,284 B1 | 4/2002 | Strizhevskiy | |
| 6,765,958 B1 * | 7/2004 | Dowling | 375/232 |
| 6,781,208 B2 | 8/2004 | Okumura | |
| 6,794,762 B2 | 9/2004 | Ikegami et al. | |
| 2003/0203717 A1 * | 10/2003 | Chuprun et al. | 455/12.1 |
| 2004/0197537 A1 | 10/2004 | Newman et al. | |

* cited by examiner

*Primary Examiner*—Hung Van Duong
(74) *Attorney, Agent, or Firm*—Kilpatrick Stockton LLP

(57) ABSTRACT

Techniques for making robust but precise electrical components, such as molded equalizers designed for interface with amplifiers in CATV or other communications equipment, are disclosed. An exemplary embodiment of an electrical component includes an injection-molded housing encapsulating an equalizer circuit and with pins protruding from one end. The housing and pins are designed for interface with predetermined locations in CATV amplifiers or optic nodes. The addition of the molten plastic changes the performance of the equalizer circuit, requiring pre-mold adjustments to the circuit design to be made in order for the final molded equalizer to achieve the desired operating characteristics.

12 Claims, 16 Drawing Sheets

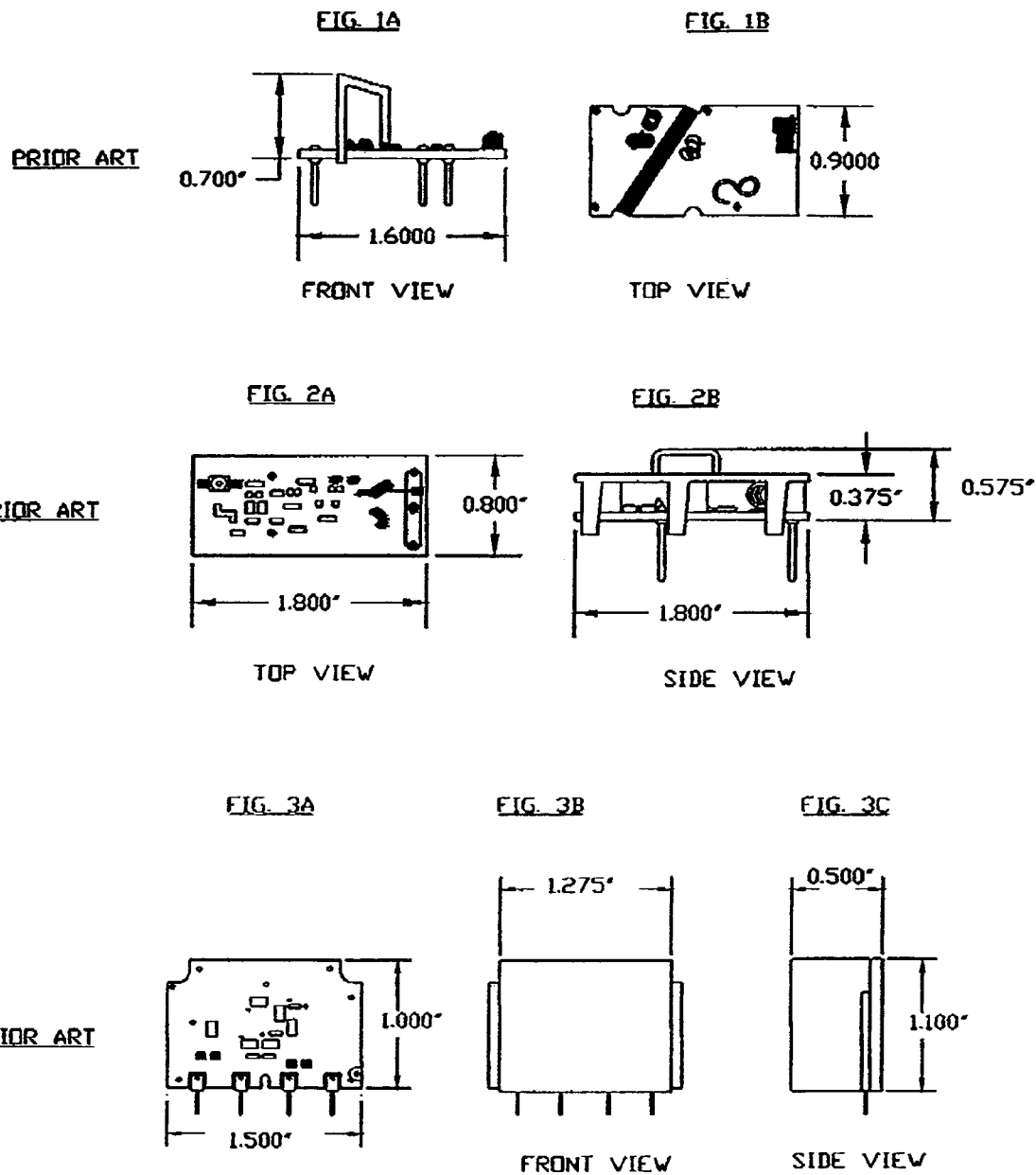

FIGURE 4A
FIGURE 4B
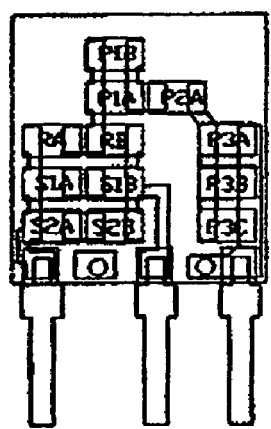
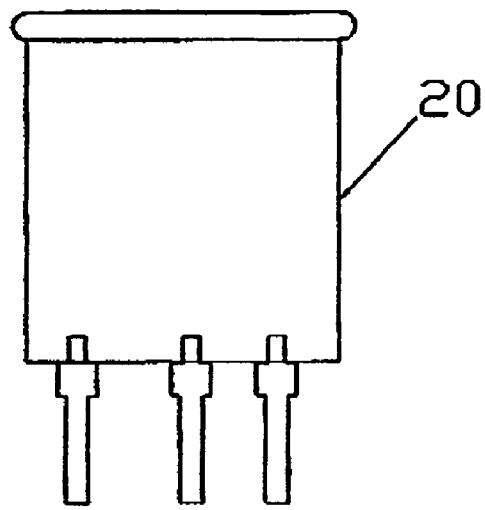

BACK VIEW

FRONT VIEW

SIDE VIEW

BOTTOM VIEW

TOP VIEW

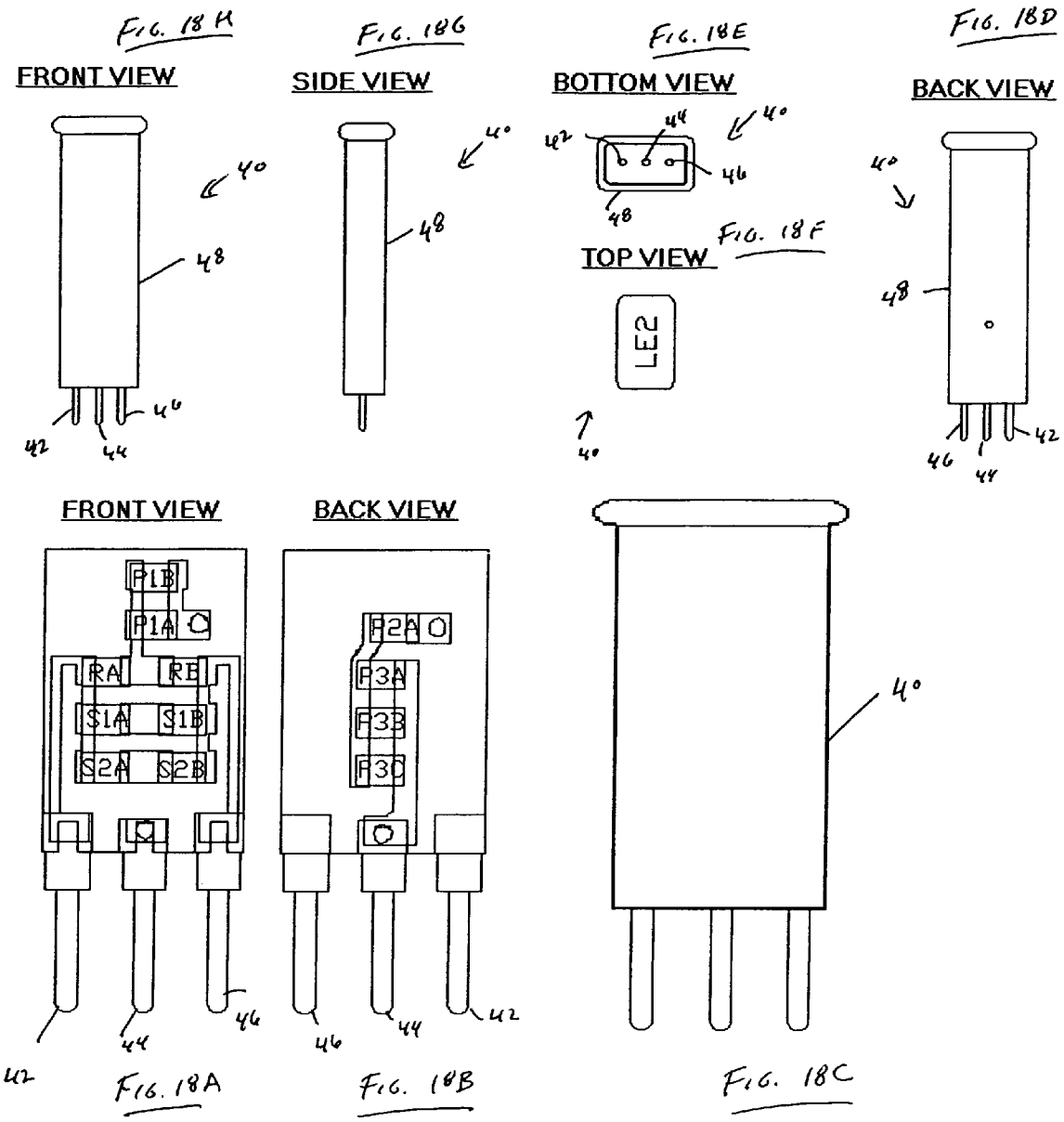

MOLDED ELECTRONIC COMPONENTS

This application is a continuation-in-part of U.S. application Ser. No. 10/636,066, filed Aug. 4, 2003, entitled "Molded Electronic Components," which claims the benefit of U.S. Provisional Application Ser. No. 60/401,133, entitled "Molded Electronic Components," filed Aug. 5, 2002, the entire contents of each of which are hereby incorporated by reference.

FIELD OF THE INVENTION

This invention relates to techniques for manufacturing electrical components. For instance, these techniques may be used to make molded equalizers for use with communications equipment, particularly for use in amplifiers, fiber optic nodes, and head-end equipment in cable television (CATV) systems. These techniques may also be used to manufacture AC bypass coils or filters, cable simulators, surge protectors, diplex filters, and other plug-in devices common to broadband amplifiers, fiber optic nodes, and head-end equipment used in the CATV industry.

BACKGROUND OF THE INVENTION

Cable television (CATV) and other communications systems use many electronic components. An example of one such component is the equalizer. Equalizers are used by the CATV industry to correct for signal loss that occurs as signals flow through the long lengths of coaxial cable, strung between telephone poles or buried underground, to various points where consumers are then able to access the signals. Coaxial cable offers some finite loss to the signals transmitted through it. In other words, if signal is injected at 100% power at one end at all frequencies, less than 100% of that signal will be recovered from the other end of the cable and varies depending on the frequency. The loss associated with the coaxial cable is not the same at all frequencies, and the loss typically increases as frequency increases. The result is that, after passing through a length of cable, the spectrum of radio frequency ("RF") signals is stronger at low frequencies and weaker at high frequencies due to cable loss, which is known as signal slope. It is harder to process a full signal spectrum with the lower frequencies stronger than the higher frequencies. Preferably, it is desirable that all frequencies are at essentially the same level in terms of signal strength, which is known in the communications industry as a flat spectrum. In an optical node application, the signal arrives at the optical receiver basically flat. A linear equalizer is used in the node to provide the desired linearly titled output.

Amplifiers, fiber optic nodes, and head-end equipment are utilized in CATV systems, and most utilize a removable equalizer (cable or linear). As applied to the CATV industry, an equalizer is typically a plug-in device used to adjust the desired slope of a cable signal of an RF broadband signal in amplifiers, fiber optic nodes, and head-end equipment. An equalizer is typically a passive R-L-C (resistor-inductor-capacitor) circuit designed with a response signature that negates, or flattens, a corresponding amount of coaxial cable loss or a linear tilt for various operating frequencies. Referring back to the spectral analogy above, the signal spectrum exiting a length of coaxial cable generally has a stronger signal level at lower frequencies than higher frequencies. The signals are routed through an equalizer of appropriate value for the given cable length. Typically, the equalizer does not adjust the "lower" power or signal levels at the higher frequencies but rather attenuates the "higher" signals found at the lower frequencies to create a flat frequency spectrum. This means that all frequencies are about the same amplitude as a result of being routed through the equalizer.

Previous equalizers, such as the equalizer shown in FIGS. 1A and 1B, generally include a printed circuit board with components (such as resistors, inductors, and capacitors) mounted on the board and contact pins exiting the circuit board. The equalizer plugs in to its host unit, for example, a CATV amplifier, by insertion of the pins into corresponding sockets on the host unit. The friction between the pins and sockets holds the equalizer in place, but the delicate electronic components are left exposed. This is a problem because each equalizer has different operating characteristics and movement of the circuit elements could cause those characteristics to change.

In the electronics industry, it has long been known that one can encapsulate certain active circuit components in plastic or similar materials to add robustness and protection to the circuit. For instance, integrated circuit makers like VLSI and LSI have obtained U.S. Pat. Nos. 5,448,825 and 5,570,272, respectively, for methods and apparatuses for encapsulating integrated circuits. Indeed, the art of encapsulating integrated circuits is quite advanced, with patents being awarded on the particular materials for encapsulating the integrated circuits, such as U.S. Pat. No. 6,030,684, or on materials with particular thermal characteristics, such as the material described in U.S. Pat. No. 5,909,915.

While active, integrated circuits have long been encapsulated, passive circuits like equalizers have not been. The encapsulating material itself would modify the operating characteristics of these circuits by effectively adding capacitance to the circuit. Yet applications for these circuits often require very precise operating characteristics. Indeed, to allow service personnel to adjust an equalizer to match the required field conditions, tunable equalizers were developed with removable, snap-on covers, as shown in FIGS. 2A and 2B. FIGS. 3A–3C show a non-tunable, double-sided equalizer with a snap-on enclosure, although open areas remain between the cover and the substrate holding the circuit elements.

The advantage of such tunable equalizers or covered equalizers is that they allowed for re-tuning of the circuit if necessary and/or provided some protection of the circuit to maintain the equalizer's desired operating characteristics. But disadvantages abounded. The circuit elements remained relatively exposed, the products were harder to manufacture given their small sizes and consequent small profiles. The snap-on covers or enclosures are manufactured separately from the circuit, and attached to the completed circuit at some late stage in the manufacturing of the equalizer. The snap-on cover does not physically touch the circuit components because it would impact the electrical circuit, but the cover often touches the edges of the circuit board. Although providing some cover and protection to the equalizer circuit, the snap-on plastic cover is problematic because the cover can come off or shift physically on the circuit and give the equalizer a flimsy feel. Additionally, if the cover contacts the circuit, it may change the performance of the equalizer.

Accordingly, there is a need for an equalizer that is more robust and easily handled such that the electronic components of the circuit are adequately protected and do not require periodic tuning.

SUMMARY OF THE INVENTION

The present invention provides a molded passive circuit. The circuit is designed to have a first set of operating characteristics. After molding, the circuit interacts with the molding material to create a component that operates at a second set of operating characteristics that are the desired characteristics for the component part. By designing the circuit to account for the impact of the encapsulating material upon the performance of the circuit, a robust but precise electronic component may be created.

In one embodiment, the component is an equalizer designed for interface with CATV or other communications equipment, particularly predetermined locations in amplifiers or optical nodes used in CATV systems. An exemplary molded equalizer generally includes an injection-molded housing encapsulating an equalizer circuit and with pins protruding from one end. The equalizer circuit is a passive R-L-C circuit. The housing and pins are designed for interface with predetermined locations in CATV amplifiers or optical nodes. Certain exemplary embodiments are two-port devices, with an input, an output, and ground, and are typically used in a 75-ohm or 50-ohm environment. Certain embodiments may be used to equalize or flatten a curved signal, while other embodiments may be used to flatten a linear signal.

In an exemplary embodiment, injection molding is used to inject molten plastic into a cavity around the equalizer circuit and the board on which the circuit is mounted. The plastic then hardens and encapsulates the circuit and the board. The injection-molded housing and the circuit are one inseparable piece, and the final product is extremely robust and leaves no portion of the electronic components of the circuit exposed in any way. The addition of the plastic changes the performance of the equalizer circuit, requiring pre-mold adjustments to be made in order for the molded equalizer to have the desired operating characteristics. The housing acts as an additional capacitor. Prior to addition of the injection-molded housing, the equalizer circuit is designed to anticipate the effects of the addition of the housing because the housing becomes a part of the circuit.

The present invention also includes methods for manufacturing robust, but precise passive circuit components. An embodiment of a method of this invention generally includes: designing the circuit to operate at a first set of operating characteristics; encapsulating the circuit in a particular material, such as plastic, resin, or the like; retesting the encapsulated circuit to determine a second set of operating characteristics; and, if necessary, modifying the design of the circuit to account for the effect of the encapsulating material so that the overall encapsulated component performs at a predetermined set of operating characteristics.

BRIEF DESCRIPTION OF THE DRAWINGS

FIGS. 1A and 1B show front and top views, respectively, of a coverless prior art equalizer.

FIGS. 2A and 2B depict top and side views, respectively, of a partially-covered prior art equalizer.

FIGS. 3A, 3B, and 3C illustrate top, front, and side views, respectively, of a prior art equalizer with a snap-on cover.

FIGS. 4A and 4B show an exemplary embodiment of a molded equalizer according to the present invention, with and without the molding.

FIGS. 18A–18C show an exemplary embodiment of a molded equalizer according to the present invention, with and without the molding.

FIGS. 18D–18H show back, bottom, top, side, and front views, respectively, of a molded equalizer according to certain exemplary embodiments of the present invention.

DETAILED DESCRIPTION OF THE INVENTION

Figure 5A:
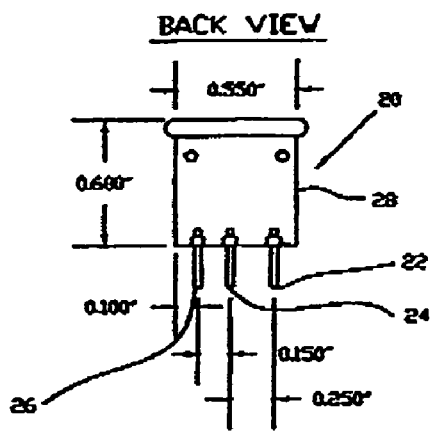
FIGS. 5A–5E show back, front, side, bottom, and top views, respectively, of a molded equalizer according to certain exemplary embodiments of the present invention.
Figure 5B:
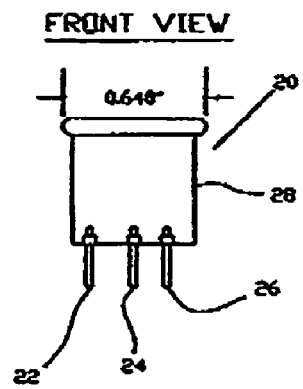
Figure 5C:
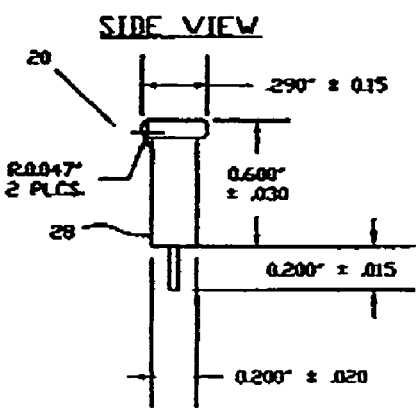
Figure 5D:
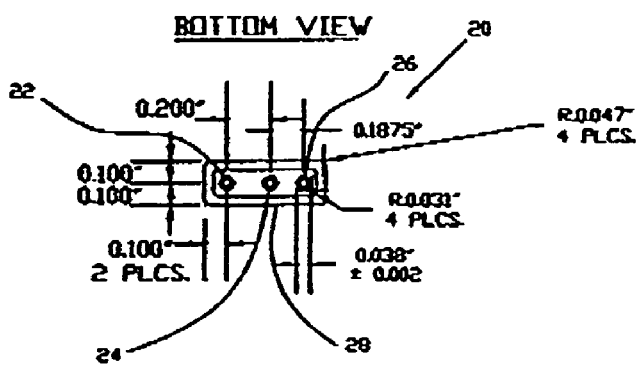

Before further describing certain exemplary embodiments of the present invention that are shown in the drawings, the following terms are explained, although more thorough understanding of the terms can be reached by resorting to this entire document. These term explanations are not intended to be conclusive, as technology will change and skilled persons will recognize other ways to implement the same functionality. The term "housing" includes any casing, shell, or member that is formed such that at least a portion of the housing encapsulates the electrical components of the equalizer circuit. Pins includes any prong(s), plug(s), connector(s), tube(s), wire(s), or other member that may be inserted into a socket, jack, or other opening or any electrical member that may be electrically coupled to a socket, jack, or other opening whether or not physical contact is made. The embodiments described herein may interface with a predetermined location in CATV or other communications equipment, for example a predetermined location in an amplifier or optical node used in CATV systems. Certain embodiments may be used to equalize or flatten a curved signal, while other embodiments may be used to flatten a linear signal.

An exemplary embodiment of a molded equalizer is shown in FIGS. 4B and 5A–5E. FIGS. 4A and 4B show both an un-molded equalizer and a molded equalizer for reference, as well as for comparison with the prior art equalizers shown in FIGS. 1A–3C. An exemplary molded equalizer with approximate dimensions, in inches, is shown in FIGS. 5A–5E.

Figure 5E:
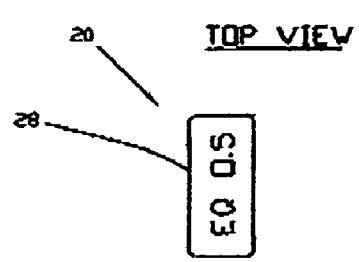

As shown in FIGS. 5A–5E, a molded equalizer 20 includes pins 22, 24, and 26 that extend from a bottom end of a housing 28. In the exemplary embodiment shown, pins 22 and 24 are spaced approximately 0.15 inches apart, while pins 24 and 26 are spaced approximately 0.20 inches apart. The spacing of the pins is based on the predetermined location with which molded equalizer 20 is designed to interface (e.g., an amplifier in CATV systems). In the exemplary embodiment shown in FIGS. 5A–5E, pin 22 or 24 is input, pin 24 or 22 is output, and pin 26 is ground. As shown in FIG. 5E, a dB value of molded equalizer 20 is hot-stamped on the top of molded equalizer 20 (in this case, 0.5 dB). Equalizers typically have dB values ranging from 0 to 26 dB, and the characteristic impedance for the majority of equalizers is 75 ohms, but may be 50 ohms or of a similar impedance.

Another exemplary embodiment of a molded equalizer is shown in FIGS. 18A–18H. A molded equalizer 40 includes pins 42, 44, and 46 that extend from a bottom end of a housing 48. In the exemplary embodiment shown, pins 42, 44, and 46 have a bi-directional, three-in-line pin arrangement that is commonly known in the communications and CATV industry as a JXP footprint. The spacing of the pins in the JXP footprint is based on the predetermined location with which molded equalizer 40 is designed to interface. In the exemplary embodiment shown in FIGS. 18A–18H, pin 42 or 46 is input, pin 46 or 42 is output, and pin 44 is ground. As shown in FIG. 18F, a dB value of molded equalizer 40 is hot-stamped on the top of molded equalizer 40 (in this case, 2 dB with the "LE" indicating that the equalizer is a linear equalizer, as further described below). Equalizers typically have dB values ranging from 0 to 26 dB, and the characteristic impedance for the majority of equalizers is 75 ohms, but may be 50 ohms or of a similar impedance.

Certain exemplary embodiments of molded equalizers according to this invention may be used to flatten curved signals or linear signals. For example, the signal of coaxial cable is curved, while the signal of fiber optic cable is linear. Molded equalizers according to this invention may be cable equalizers or linear equalizers, meaning they may be used to flatten curved or linear signals. For example, a linear molded equalizer may be used to flatten a linear signal that has a significant upward or downward slope. The signal received at the optical node is generally flat, so a linear equalizer is used to provide the desired linear tilt output to compensate for the linear loss of the cable in the amplifier.

Equalizers are used in the CATV industry to compensate for loss that occurs in transmitting RF signals from a CATV trunk station to a subscriber's home. The function of an equalizer is to "equalize" (i.e., create the same amplitude or loss at all frequencies) the signal coming into the amplifier. The equalizer circuit may be a passive circuit, taking the low amplitude of the incoming signal and flattening the signal below that point before the signal is transmitted to the rest of the cable amplifier. Equalizers of varying dB values are used because CATV amplifiers are located at varying distances from the trunk system (i.e., the length the signal travels is not always the same). Because of saturation of bandwidth in the 800 MHz range, it has been desirable to expand into frequencies above and beyond this range, such as the 1 GHz (1000 MHz) range or higher, and thus molded equalizers that work at 1 GHz, 1.2 GHz, or higher are useful. It should be understood that this invention is not limited by frequency and that it is contemplated that certain embodiments of equalizers in accordance with this invention may be used at 1.5, 2, or 3 GHz or even higher frequencies.

In FIGS. 6–17, insertion loss, input return loss, and output return loss are shown on graphs for various exemplary molded equalizers, with results in tables 1–24 as further explained below. To briefly summarize, the exemplary equalizers for which results are shown in FIGS. 6–8 are molded cable equalizers of 2 dB, 3 dB, and 4 dB that have footprints in accordance with the exemplary embodiment shown in FIGS. 5A–5E. The exemplary equalizers for which results are shown in FIGS. 9–11 are molded linear equalizers of 6 dB, 8 dB, and 12 dB that have footprints in accordance with the exemplary embodiment shown in FIGS. 5A–5E. The exemplary equalizers for which results are shown in FIGS. 12–14 are molded linear equalizers of 6 dB, 7 dB, and 11 dB that have footprints in accordance with the exemplary embodiment shown in FIGS. 18A–18H. Finally, the exemplary equalizers for which results are shown in FIGS. 15–17 are molded linear equalizers of 2 dB, 3 dB, and 6 dB that have footprints in accordance with the exemplary embodiment shown in FIGS. 18A–18H and that are designed specifically to work at frequencies of, or have a desired set of predetermined operating characteristics at, 1 GHz or higher. It should be understood that certain embodiments of molded equalizers of this invention are not limited based on the number of pins, pin spacing, size, characteristic impedance, or frequency ranges of the exemplary embodiments described below.

Figure 6A:
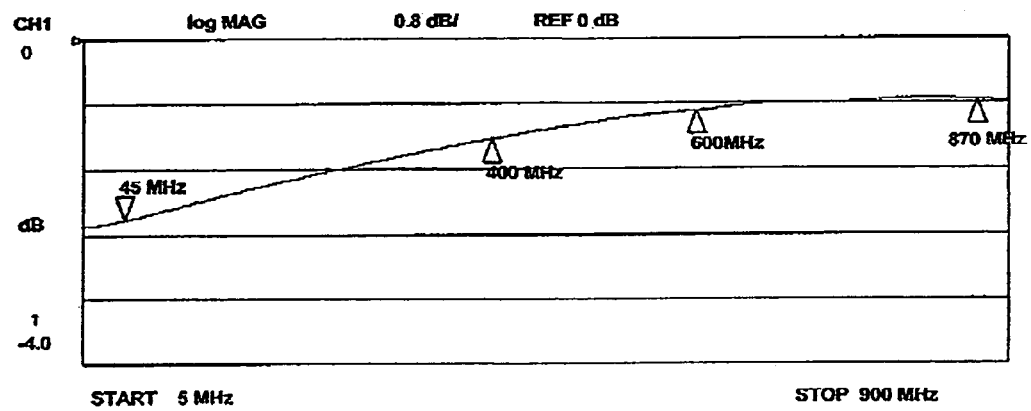
FIG. 6A illustrates frequency (MHz) versus insertion loss (dB) for an exemplary 2 dB cable equalizer.

FIGS. 6A–8C depict a sweep in frequency (in MHz) versus loss (in dB) for three different exemplary cable equalizer values. On the frequency axis (x-axis), the scale is linear from 5 to 900 MHz, which is a portion of the bandwidth used in the CATV industry. On the loss axis (y-axis), the scale is −50 to 0 dB for figures showing input and output return loss (FIGS. 6B, 6C, 7B, 7C, 8B, and 8C). For insertion loss, the scale runs from −4 to 0 dB (FIGS. 6A, 7A, and 8A).

Figure 7A:
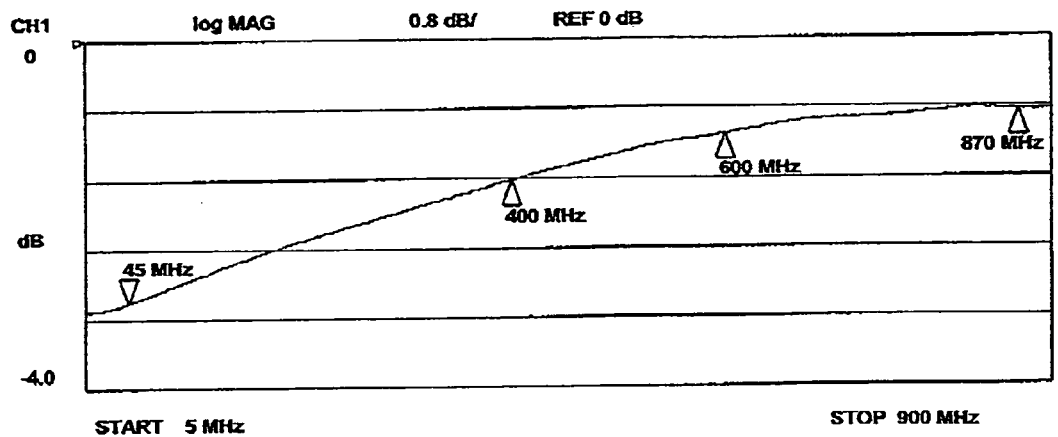
FIG. 7A illustrates frequency (MHz) versus insertion loss (dB) for an exemplary 3 dB cable equalizer.
Figure 8A:
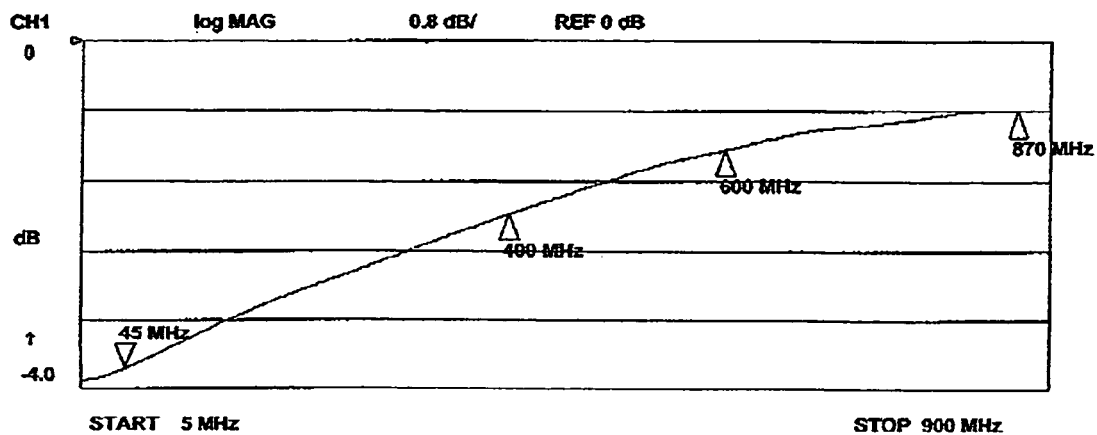
FIG. 8A illustrates frequency (MHz) versus insertion loss (dB) for an exemplary 4 dB cable equalizer.

Insertion loss is approximately the same whether the equalizer is molded or un-molded. An equalizer's assigned value (e.g., 0.5 dB, 2.0 dB, 4.0 dB, etc.) is based on the approximate insertion loss of the equalizer at low frequencies. For illustration purposes, insertion loss graphs for exemplary 2 dB, 3 dB, and 4 dB equalizers are shown in FIGS. 6A, 7A, and 8A. These exemplary equalizers flatten a non-linear signal and are shaped in accordance with the embodiment shown in FIGS. 5A–5E.

Certain exemplary embodiments of the present invention are two-port devices, with an input, an output, and a ground, and are used in a 75-Ohm, 50-Ohm, or similar environment. The molded equalizer itself may be, for example, a 75 Ohm device in order to have a matched system (i.e., both the transmission line and the system component impedance are 75 Ohms). In an ideal system, the entire incoming signal is transmitted through the equalizer. However, in reality, the transmission line and all of the system components and parts are not an ideal 75 Ohms, and thus not all of the signal power is transferred into the equalizer. Instead, some of the signal is reflected back to the source. Accordingly, return loss is measured on both the input side and the output side of the equalizer (input return loss and output return loss). The goal is to measure a lower power signal coming back from the input side of the equalizer. In fact, the lower the better, with the minimal input and output return loss being about −20 dB and about −18 dB at higher frequencies.

In contrast to insertion loss, return loss of a molded equalizer varies from that of an un-molded equalizer of the same dB value. For each FIGS. 6B, 6C, 7B, 7C, 8B, and 8C, the return loss for an un-molded equalizer is shown by the top line of each graph, while the return loss for a molded equalizer is shown by the bottom line with the trace arrows. Although the lines may cross in these or other embodiments described further below, the line with trace arrows is always indicating the molded equalizer. The value of return loss is measured at four different frequencies (45, 400, 600, and 870 MHz) within the spectrum used in the CATV industry and those values are reproduced in the tables below for the exemplary molded equalizers.

FIG. 6A shows insertion loss as a function of frequency for an exemplary 2 dB equalizer. The measured insertion loss for various frequencies is stated below in Table 1:

TABLE 1

| Frequency (MHz) | Insertion Loss (dB) |
|---|---|
| 45 | −2.216 |
| 400 | −1.229 |
| 600 | −0.884 |
| 870 | −0.762 |

FIG. 7A shows insertion loss as a function of frequency for an exemplary 3 dB equalizer. The measured insertion loss for various frequencies is stated below in Table 2:

TABLE 2

| Frequency (MHz) | Insertion Loss (dB) |
|---|---|
| 45 | −3.006 |
| 400 | −1.615 |
| 600 | −1.090 |
| 870 | −0.834 |

FIG. 8A shows insertion loss as a function of frequency for an exemplary 4 dB equalizer. The measured insertion loss for various frequencies is stated below in Table 3:

TABLE 3

| Frequency (MHz) | Insertion Loss (dB) |
|---|---|
| 45 | −3.768 |
| 400 | −1.970 |
| 600 | −1.237 |
| 870 | −0.795 |

Figure 6B:
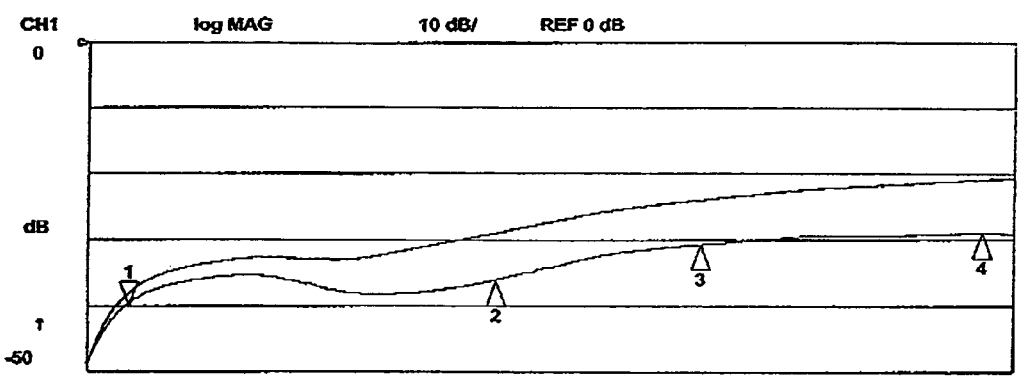
FIG. 6B shows frequency (MHz) versus input return loss (dB) for both un-molded and molded exemplary 2 dB cable equalizers.
Figure 6C:
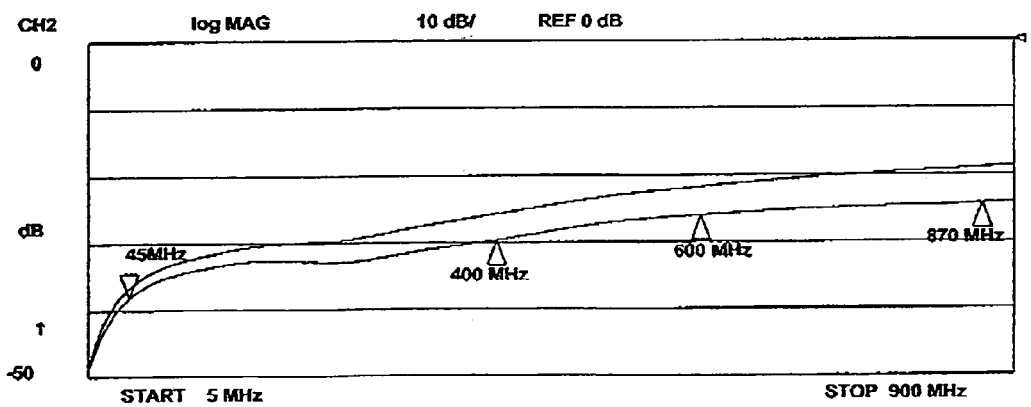
FIG. 6C shows frequency (MHz) versus output return loss (dB) for both un-molded and molded exemplary 2 dB cable equalizers.

FIG. 6B shows input return loss as a function of frequency for a 2 dB equalizer. FIG. 6C shows output return loss as a function of frequency for a 2 dB equalizer. Measured input return loss and output return loss for the 2 dB molded equalizer at various frequencies are stated below in Table 4:

TABLE 4

| Frequency (MHz) | Input Return Loss (dB) | Output Return Loss (dB) |
|---|---|---|
| 45 | −39.96 | −38.16 |
| 400 | −36.24 | −29.67 |
| 600 | −30.80 | −26.00 |
| 870 | −29.00 | −24.25 |

Figure 7B:
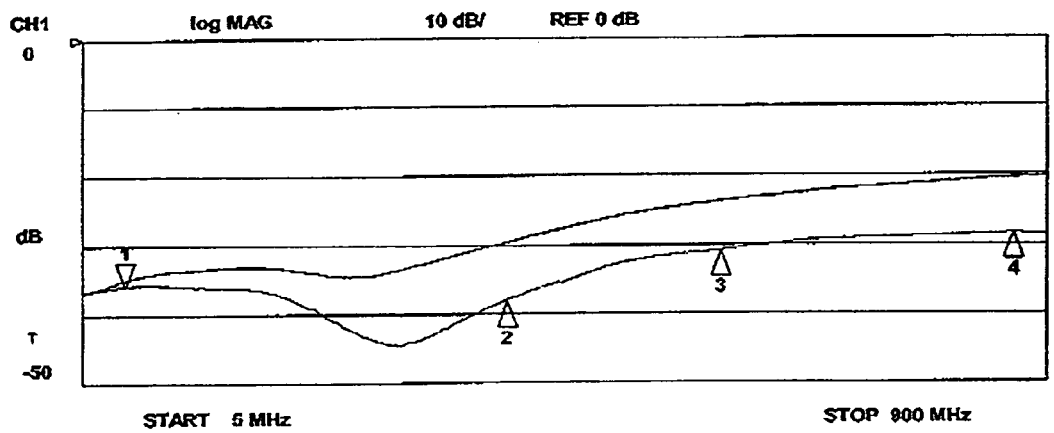
FIG. 7B shows frequency (MHz) versus input return loss (dB) for both un-molded and molded exemplary 3 dB cable equalizers.
Figure 7C:
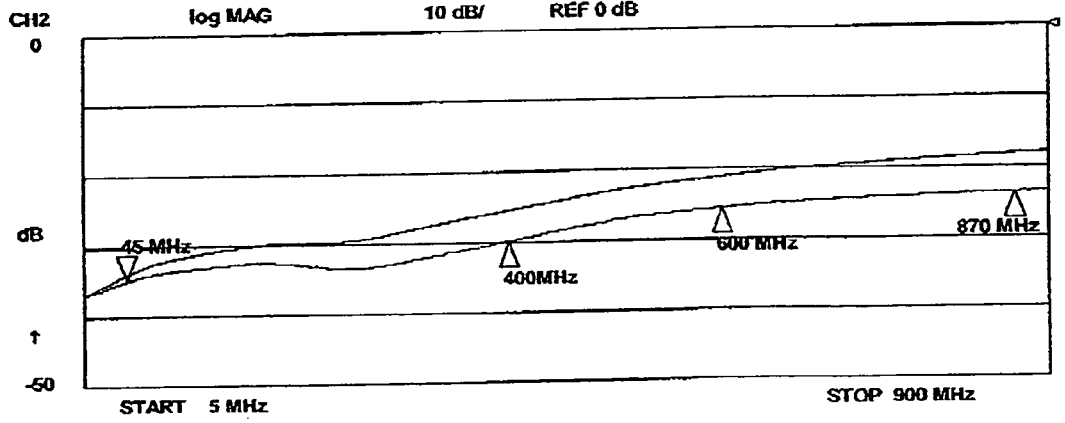
FIG. 7C shows frequency (MHz) versus output return loss (dB) for both un-molded and molded exemplary 3 dB cable equalizers.

FIG. 7B shows input return loss as a function of frequency for a 3 dB equalizer. FIG. 7C shows output return loss as a function of frequency for a 3 dB equalizer. Measured input return loss and output return loss for the molded 3 dB equalizer at various frequencies are stated below in Table 5:

TABLE 5

| Frequency (MHz) | Input Return Loss (dB) | Output Return Loss (dB) |
| --- | --- | --- |
| 45 | −35.98 | −34.83 |
| 400 | −38.12 | −29.86 |
| 600 | −30.82 | −25.53 |
| 870 | −28.44 | −23.54 |

Figure 8B:
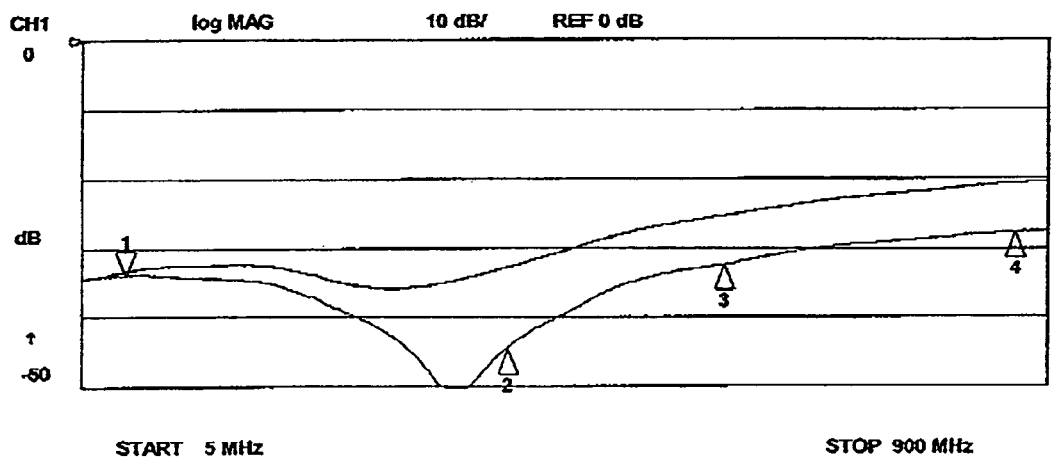
FIG. 8B shows frequency (MHz) versus input return loss (dB) for both un-molded and molded exemplary 4 dB cable equalizers.
Figure 8C:
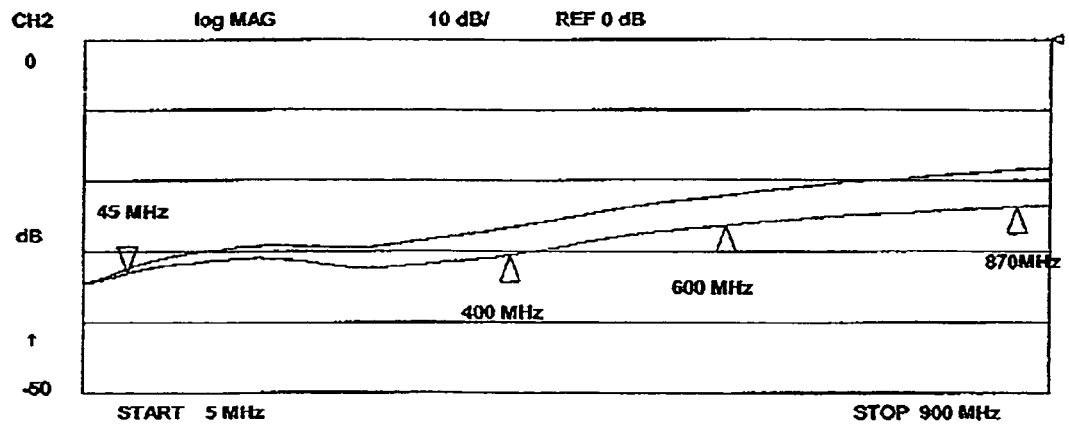
FIG. 8C shows frequency (MHz) versus output return loss (dB) for both un-molded and molded exemplary 4 dB cable equalizers.

FIG. 8B shows input return loss as a function of frequency for a 4 dB equalizer. FIG. 8C shows output return loss as a function of frequency for a 4 dB equalizer. Measured input return loss and output return loss for the molded 4 dB equalizer at various frequencies are stated below in Table 6:

TABLE 6

| Frequency (MHz) | Input Return Loss (dB) | Output Return Loss (dB) |
| --- | --- | --- |
| 45 | −34.08 | −33.04 |
| 400 | −44.56 | −30.51 |
| 600 | −32.34 | −26.35 |
| 870 | −27.65 | −23.70 |

As shown in FIGS. 6B, 6C, 7B, 7C, 8B, and 8C for the exemplary 2, 3, and 4 dB equalizers, the input and output return losses are better for the molded equalizers as compared to the un-molded equalizers of the same dB value. The input and output return losses of the molded equalizers have the desired operating characteristics for use in amplifiers in CATV equipment, while the un-molded 2, 3, and 4 dB equalizers of FIGS. 6–8 do not have the desired operating characteristics. To obtain the desired operating characteristics, the present invention accounts for adding an injection-molded housing in designing an equalizer circuit of an un-molded equalizer. Indeed, previous equalizers have never used such molding because the resulting housing acts as an electrical component of the equalizer, thereby changing the circuit's performance characteristics.

In an exemplary embodiment, injection molding is used to inject molten plastic into a cavity around the circuit board. The plastic then hardens and encapsulates the equalizer circuit and circuit board. Optionally, the molded plastic may be of different colors or include a logo thereon as an identifier. The injection-molded housing and the circuit are one inseparable piece. In fact, the housing becomes a component of the electrical circuit. The final product is extremely robust and leaves no portion of the electronic components of the circuit exposed in any way. Additionally, the final product is a much smaller part when compared to the prior art equalizers shown in FIGS. 1A–3C. In an exemplary embodiment, the plastic used for the injection molding is polypropylene, but other plastics, resins, and the like may be used as well with the effects of each on the circuit being slightly different, as is understood by those skilled in the art.

The addition of the plastic (housing) changes the performance of the equalizer circuit, so pre-mold adjustments are made in order for the molded equalizer (i.e., the final product) to have the desired operating characteristics. The housing acts as a capacitor, adding another active electrical component to the equalizer circuit, and is inseparable from the other components of the circuit. Prior to addition of the injection-molded housing, the equalizer circuit has undesirable operating characteristics and performs poorly because the equalizer circuit is designed to anticipate the effects of the housing that will be later added. Simple experimentation and trial and error are used to determine such effects. As noted above, the effects may vary with the particular plastic or resin used and this will be discovered through simple experimentation. Examples of the effects of injection molding are shown in FIGS. 6B, 6C, 7B, 7C, 8B, and 8C and discussed above.

Figure 9A:
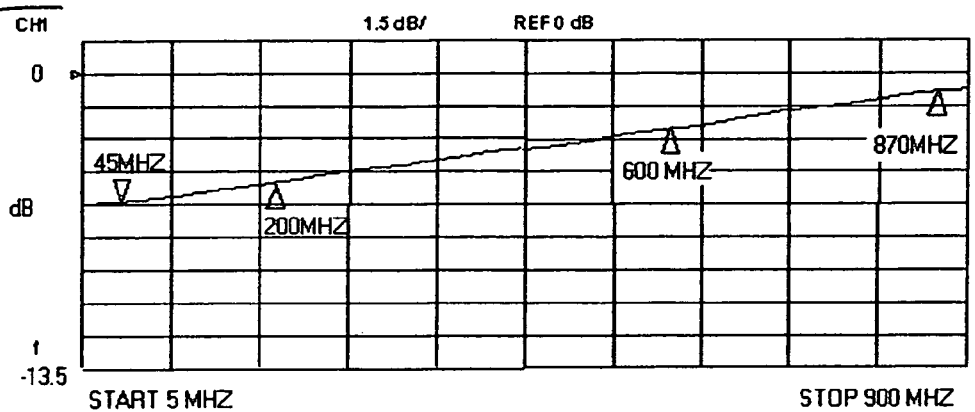
FIG. 9A illustrates frequency (MHz) versus insertion loss (dB) for an exemplary 6 dB linear equalizer.

FIGS. 9A–11C depict a sweep in frequency (in MHz) versus loss (in dB) for three different exemplary linear equalizer values. On the frequency axis (x-axis), the scale is linear from 5 to 900 MHz, which is a portion of the bandwidth used in the CATV industry. On the loss axis (y-axis), the scale is −45 to 0 dB for figures showing input and output return loss (FIGS. 9B, 9C, 10B, 10C, 11B, and 11C). For insertion loss, the scale runs from −13.5 to 0 dB (FIGS. 9A, 10A, and 11A).

Figure 10A:
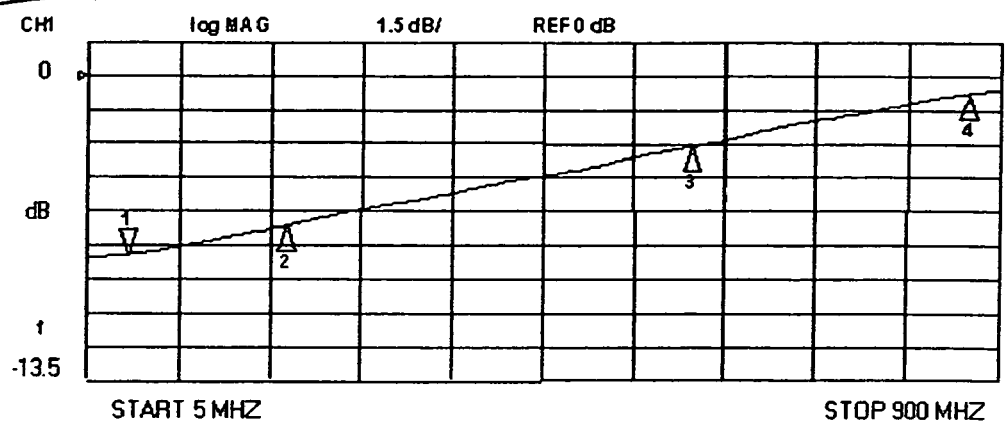
FIG. 10A illustrates frequency (MHz) versus insertion loss (dB) for an exemplary 8 dB linear equalizer.
Figure 11A:
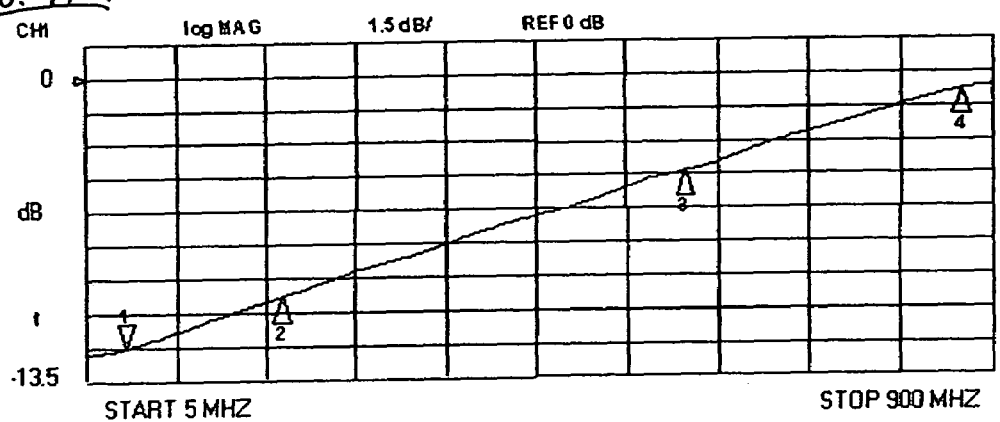
FIG. 11A illustrates frequency (MHz) versus insertion loss (dB) for an exemplary 12 dB linear equalizer.

Insertion loss is approximately the same whether the equalizer is molded or un-molded. A linear equalizer's assigned value (2 dB, 6 dB, 8 dB, 12 dB, 20 dB, etc.) is based on the approximate insertion loss of the equalizer at low frequencies. For illustration purposes, insertion loss graphs for exemplary 6 dB, 8 dB, and 12 dB linear equalizers are shown in FIGS. 9A, 10A, and 11A. These exemplary equalizers flatten a linear signal and are shaped in accordance with the embodiment shown in FIGS. 5A–5E.

In contrast to insertion loss, return loss of a molded equalizer varies from that of an un-molded equalizer of the same dB value. For each FIGS. 9B, 9C, 10B, 10C, 11B, and 11C, the return loss for an un-molded equalizer is shown by the top line of each graph, while the return loss for a molded equalizer is shown by the bottom line with the trace arrows. Although the lines may cross in these or other embodiments described herein, the line with trace arrows is always indicating the molded equalizer. The value of return loss is measured at four different frequencies (45, 200, 600, and 870 MHz) within the spectrum used in the CATV industry and those values are reproduced in the tables below for the exemplary molded linear equalizers.

FIG. 9A shows insertion loss as a function of frequency for an exemplary 6 dB linear equalizer. The measured insertion loss for various frequencies is stated below in Table 7:

TABLE 7

| Frequency (MHz) | Insertion Loss (dB) |
| --- | --- |
| 45 | −5.9229 |
| 200 | −5.0247 |
| 600 | −2.5347 |
| 870 | −0.839 |

FIG. 10A shows insertion loss as a function of frequency for an exemplary 8 dB equalizer. The measured insertion loss for various frequencies is stated below in Table 8:

TABLE 8

| Frequency (MHz) | Insertion Loss (dB) |
| --- | --- |
| 45 | −7.8975 |
| 200 | −6.6061 |
| 600 | −3.1052 |
| 870 | −0.7686 |

FIG. 11A shows insertion loss as a function of frequency for an exemplary 12 dB equalizer. The measured insertion loss for various frequencies is stated below in Table 9:

TABLE 9

| Frequency (MHz) | Insertion Loss (dB) |
|---|---|
| 45 | −12.037 |
| 200 | −9.8175 |
| 600 | −4.3155 |
| 870 | −0.7612 |

Figure 9B:
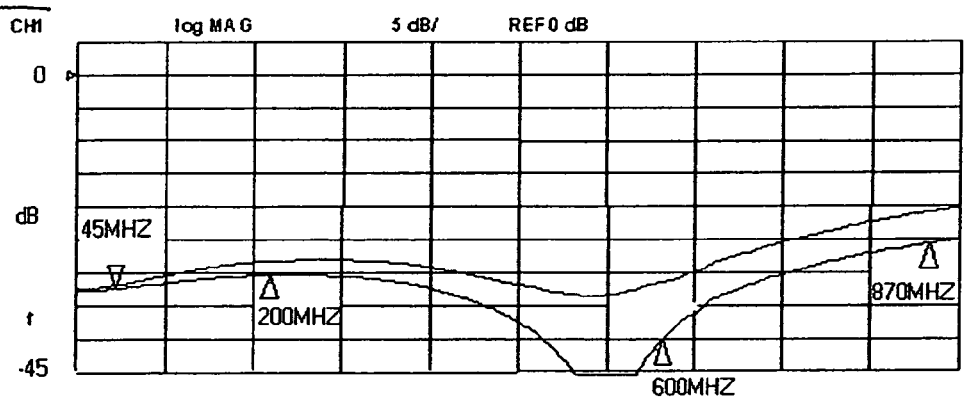
FIG. 9B shows frequency (MHz) versus input return loss (dB) for both un-molded and molded exemplary 6 dB linear equalizers.
Figure 9C:
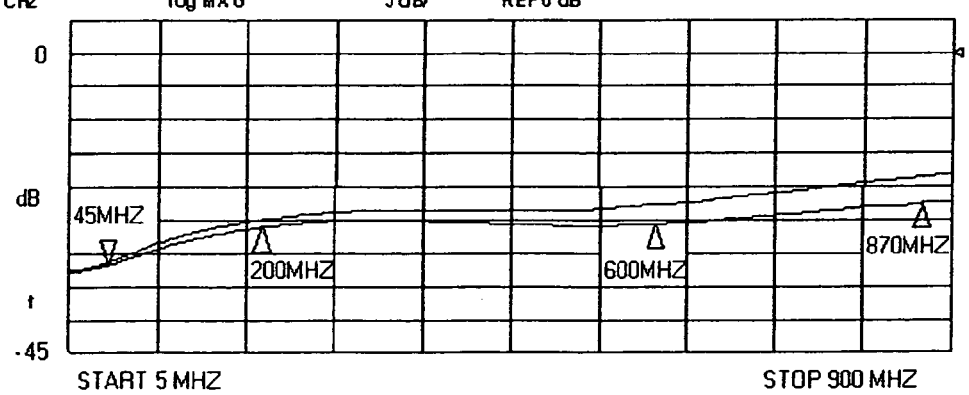
FIG. 9C shows frequency (MHz) versus output return loss (dB) for both un-molded and molded exemplary 6 dB linear equalizers.

FIG. 9B shows input return loss as a function of frequency for a 6 dB equalizer. FIG. 9C shows output return loss as a function of frequency for a 6 dB equalizer. Measured input return loss and output return loss for the 6 dB molded linear equalizer at various frequencies are stated below in Table 10:

TABLE 10

| Frequency (MHz) | Input Return Loss (dB) | Output Return Loss (dB) |
|---|---|---|
| 45 | −32.302 | −31.716 |
| 200 | −30.154 | −26.002 |
| 600 | −39.549 | −25.269 |
| 870 | −25.518 | −22.477 |

Figure 10B:
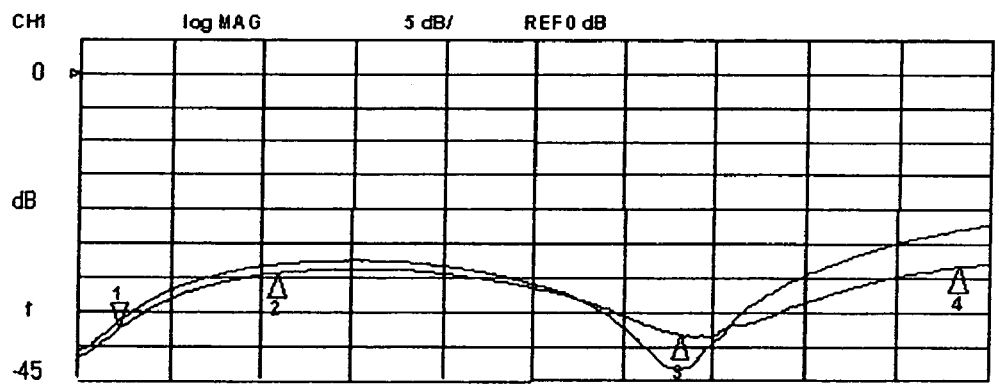
FIG. 10B shows frequency (MHz) versus input return loss (dB) for both un-molded and molded exemplary 8 dB linear equalizers.
Figure 10C:
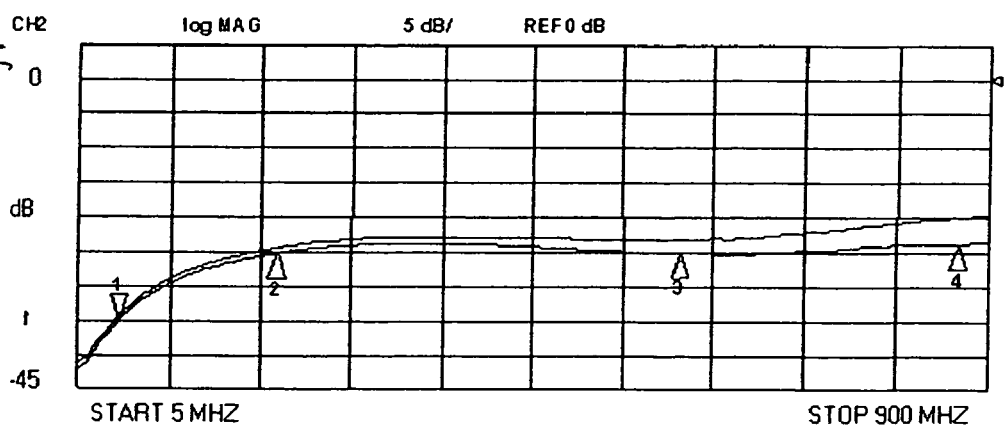
FIG. 10C shows frequency (MHz) versus output return loss (dB) for both un-molded and molded exemplary 8 dB linear equalizers.

FIG. 10B shows input return loss as a function of frequency for an 8 dB equalizer. FIG. 10C shows output return loss as a function of frequency for an 8 dB equalizer. Measured input return loss and output return loss for the molded 8 dB linear equalizer at various frequencies are stated below in Table 11:

TABLE 11

| Frequency (MHz) | Input Return Loss (dB) | Output Return Loss (dB) |
|---|---|---|
| 45 | −37.418 | −35.051 |
| 200 | −29.303 | −25.225 |
| 600 | −39.122 | −25.094 |
| 870 | −28.525 | −23.942 |

Figure 11B:
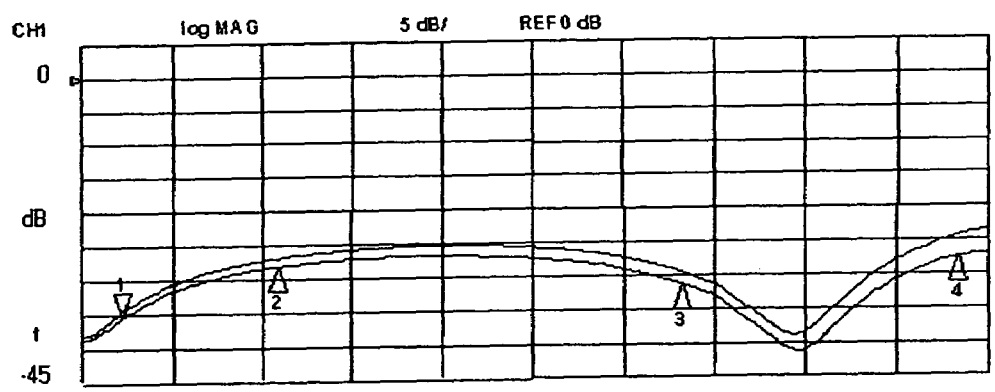
FIG. 11B shows frequency (MHz) versus input return loss (dB) for both un-molded and molded exemplary 12 dB linear equalizers.
Figure 11C:
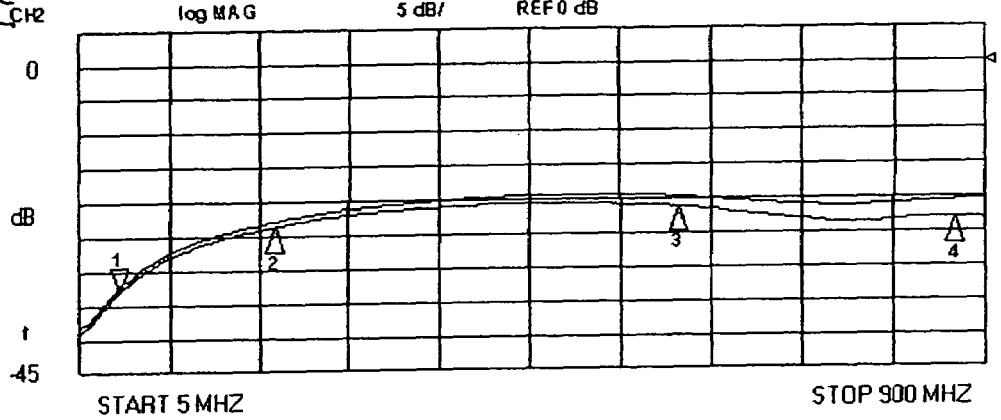
FIG. 11C shows frequency (MHz) versus output return loss (dB) for both un-molded and molded exemplary 12 dB linear equalizers.

FIG. 11B shows input return loss as a function of frequency for a 12 dB equalizer. FIG. 11C shows output return loss as a function of frequency for a 12 dB equalizer. Measured input return loss and output return loss for the molded 12 dB linear equalizer at various frequencies are stated below in Table 12:

TABLE 12

| Frequency (MHz) | Input Return Loss (dB) | Output Return Loss (dB) |
|---|---|---|
| 45 | −35.372 | −33.021 |
| 200 | −28.118 | −23.646 |
| 600 | −31.596 | −21.063 |
| 870 | −27.296 | −22.884 |

As shown in FIGS. 9B, 9C, 10B, 10C, 11B, and 11C for the exemplary 6, 8, and 12 dB linear equalizers, the input and output return losses are better for the molded equalizers as compared to the un-molded equalizers of the same dB value. The input and output return losses of the molded equalizers have the desired operating characteristics for use in amplifiers in CATV equipment, optic nodes, and other communications equipment, while the un-molded 6, 8, and 12 dB linear equalizers of FIGS. 9–11 do not have the desired operating characteristics. To obtain the desired operating characteristics, the present invention accounts for adding an injection-molded housing in designing an equalizer circuit of an un-molded equalizer, as further explained above in the several paragraphs following the tables showing results for the embodiments of non-linear molded equalizers shown in FIGS. 6–8.

Figure 12A:
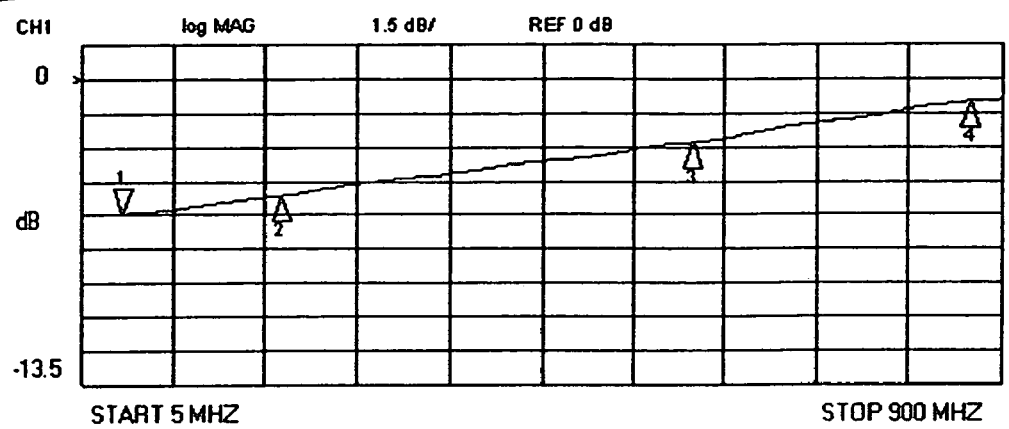
FIG. 12A illustrates frequency (MHz) versus insertion loss (dB) for an exemplary 6 dB linear equalizer.

FIGS. 12A–14C depict a sweep in frequency (in MHz) versus loss (in dB) for three different exemplary linear equalizer values. On the frequency axis (x-axis), the scale is linear from 5 to 900 MHz, which is a portion of the bandwidth used in the CATV industry. On the loss axis (y-axis), the scale is −45 to 0 dB for figures showing input and output return loss (FIGS. 12B, 12C, 13B, 13C, 14B, and 14C). For insertion loss, the scale runs from −13.5 to 0 dB (FIGS. 12A, 13A, and 14A).

Figure 13A:
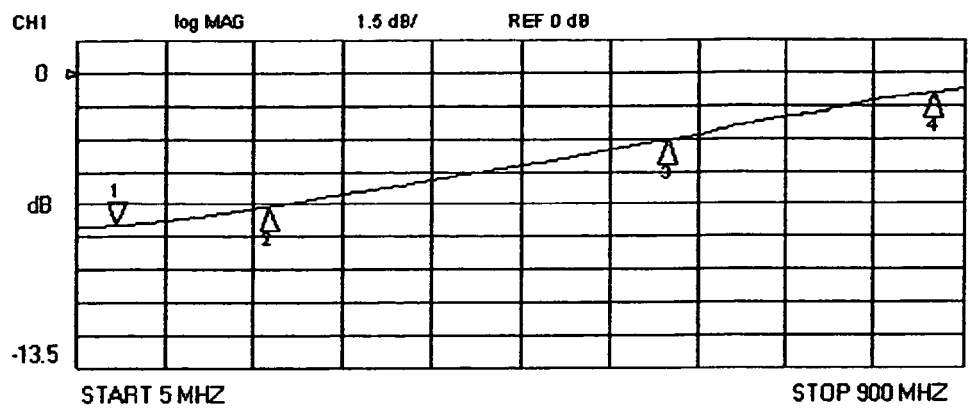
FIG. 13A illustrates frequency (MHz) versus insertion loss (dB) for an exemplary 7 dB linear equalizer.
Figure 14A:
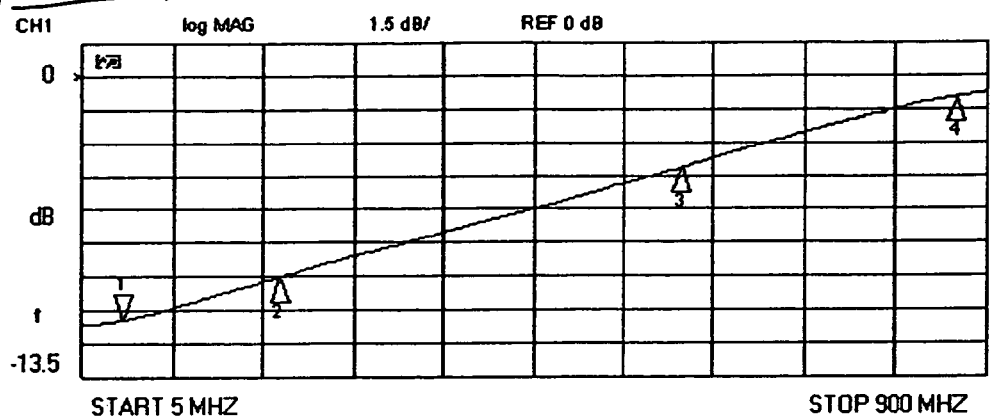
FIG. 14A illustrates frequency (MHz) versus insertion loss (dB) for an exemplary 11 dB linear equalizer.

Insertion loss is approximately the same whether the equalizer is molded or un-molded. A linear equalizer's assigned value (2 dB, 6 dB, 8 dB, 12 dB, 20 dB, etc.) is based on the approximate insertion loss of the equalizer at low frequencies. For illustration purposes, insertion loss graphs for exemplary 6 dB, 7 dB, and 11 dB linear equalizers are shown in FIGS. 12A, 13A, and 14A. These exemplary equalizers flatten a linear signal and are have a footprint in accordance with the embodiment shown in FIGS. 18A–18H.

In contrast to insertion loss, return loss of a molded equalizer varies from that of an un-molded equalizer of the same dB value. For each FIGS. 12B, 12C, 13B, 13C, 14B, and 14C, the return loss for an un-molded equalizer is shown by the top line of each graph, while the return loss for a molded equalizer is shown by the bottom line with the trace arrows. Although the lines may cross in these or other embodiments described herein, the line with trace arrows is always indicating the molded equalizer. The value of return loss is measured at four different frequencies (45, 200, 600, and 870 MHz) within the spectrum used in the CATV industry and those values are reproduced in the tables below for the exemplary molded linear equalizers.

FIG. 12A shows insertion loss as a function of frequency for an exemplary 6 dB linear equalizer. The measured insertion loss for various frequencies is stated below in Table 13:

TABLE 13

| Frequency (MHz) | Insertion Loss (dB) |
|---|---|
| 45 | −5.9101 |
| 200 | −5.1081 |
| 600 | −2.7593 |
| 870 | −1.0115 |

FIG. 13A shows insertion loss as a function of frequency for an exemplary 7 dB equalizer. The measured insertion loss for various frequencies is stated below in Table 14:

TABLE 14

| Frequency (MHz) | Insertion Loss (dB) |
|---|---|
| 45 | −6.9309 |
| 200 | −6.0885 |
| 600 | −3.0359 |
| 870 | −0.8851 |

FIG. 14A shows insertion loss as a function of frequency for an exemplary 11 dB equalizer. The measured insertion loss for various frequencies is stated below in Table 15:

TABLE 15

| Frequency (MHz) | Insertion Loss (dB) |
| --- | --- |
| 45 | −10.9119 |
| 200 | −8.9917 |
| 600 | −4.1133 |
| 870 | −0.9249 |

Figure 12B:
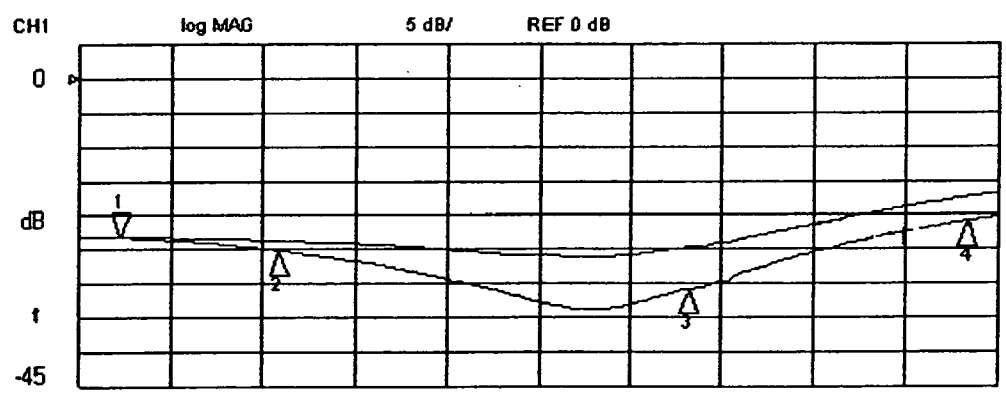
FIG. 12B shows frequency (MHz) versus input return loss (dB) for both un-molded and molded exemplary 6 dB linear equalizers.
Figure 12C:
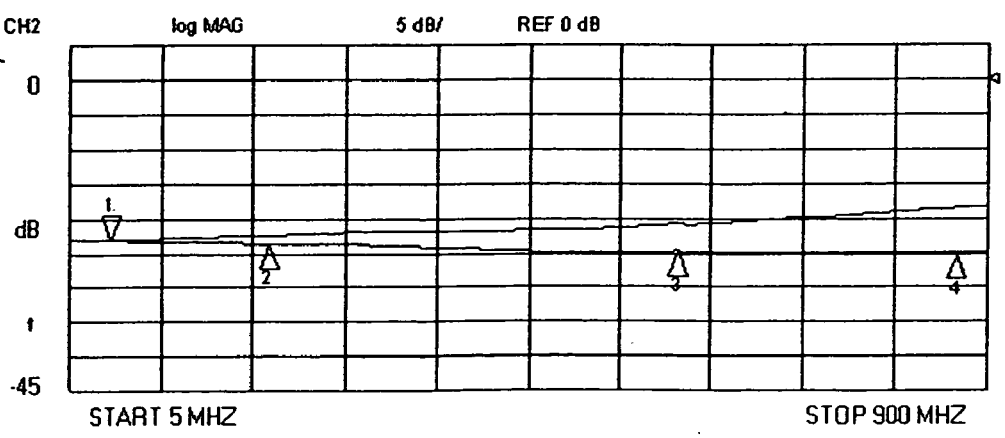
FIG. 12C shows frequency (MHz) versus output return loss (dB) for both un-molded and molded exemplary 6 dB linear equalizers.

FIG. 12B shows input return loss as a function of frequency for a 6 dB equalizer. FIG. 12C shows output return loss as a function of frequency for a 6 dB equalizer. Measured input return loss and output return loss for the 6 dB molded linear equalizer at various frequencies are stated below in Table 16:

TABLE 16

| Frequency (MHz) | Input Return Loss (dB) | Output Return Loss (dB) |
| --- | --- | --- |
| 45 | −23.183 | −23.151 |
| 200 | −24.999 | −23.544 |
| 600 | −29.771 | −24.207 |
| 870 | −20.579 | −24.651 |

Figure 13B:
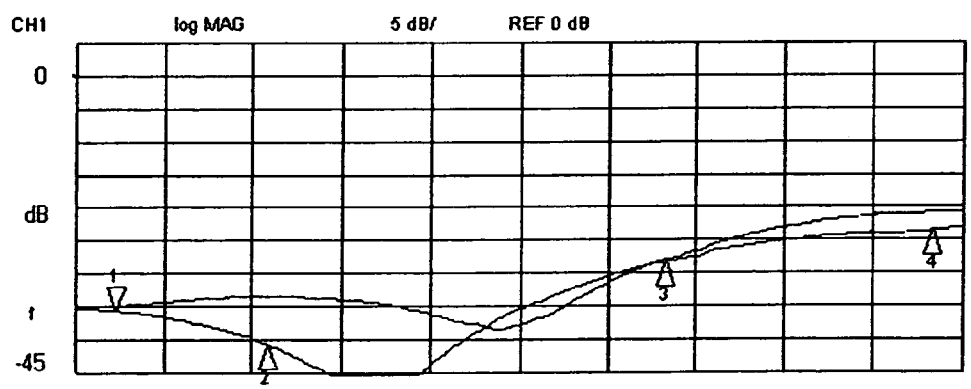
FIG. 13B shows frequency (MHz) versus input return loss (dB) for both un-molded and molded exemplary 7 dB linear equalizers.
Figure 13C:
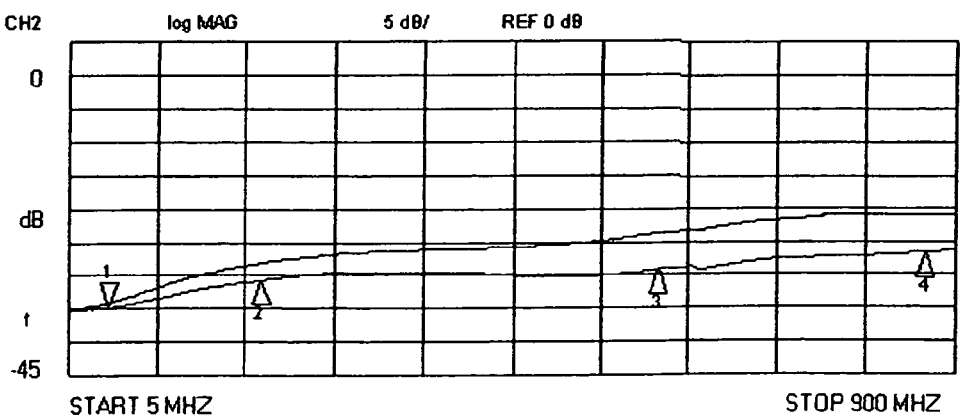
FIG. 13C shows frequency (MHz) versus output return loss (dB) for both un-molded and molded exemplary 7 dB linear equalizers.

FIG. 13B shows input return loss as a function of frequency for a 7 dB equalizer. FIG. 13C shows output return loss as a function of frequency for a 7 dB equalizer. Measured input return loss and output return loss for the molded 7 dB linear equalizer at various frequencies are stated below in Table 17:

TABLE 17

| Frequency (MHz) | Input Return Loss (dB) | Output Return Loss (dB) |
| --- | --- | --- |
| 45 | −35.404 | −34.781 |
| 200 | −39.809 | −30.617 |
| 600 | −28.565 | −28.569 |
| 870 | −23.858 | −26.908 |

Figure 14B:
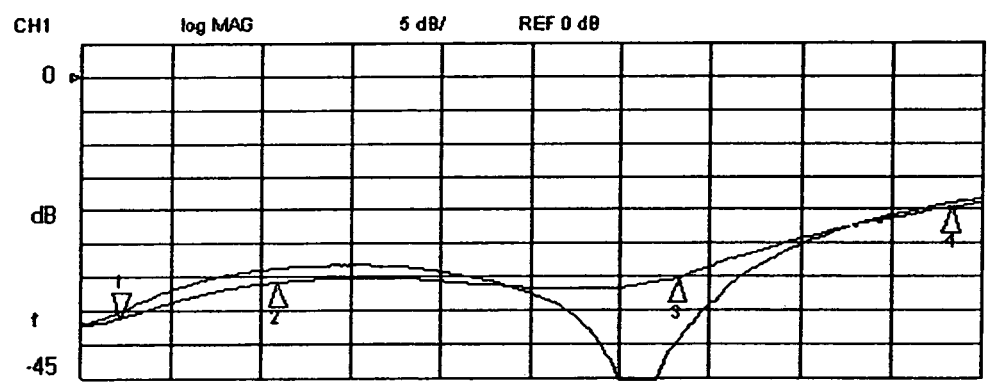
FIG. 14B shows frequency (MHz) versus input return loss (dB) for both un-molded and molded exemplary 11 dB linear equalizers.
Figure 14C:
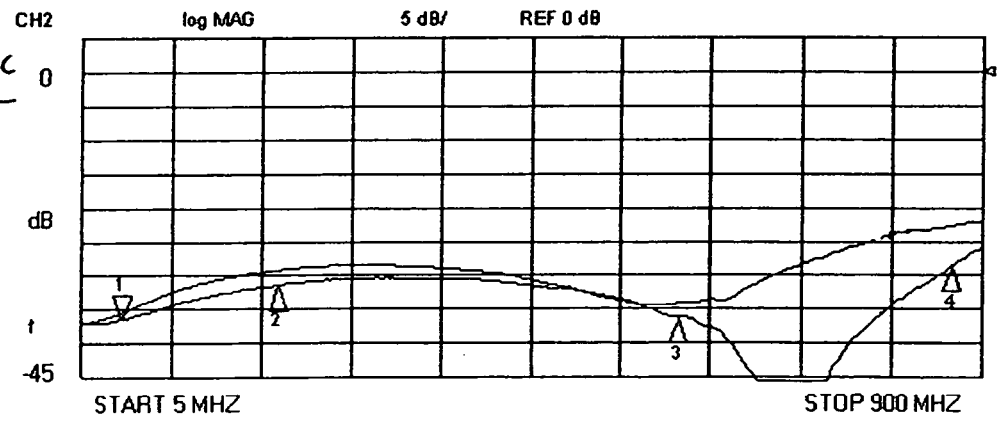
FIG. 14C shows frequency (MHz) versus output return loss (dB) for both un-molded and molded exemplary 11 dB linear equalizers.

FIG. 14B shows input return loss as a function of frequency for an 11 dB equalizer. FIG. 14C shows output return loss as a function of frequency for an 11 dB equalizer. Measured input return loss and output return loss for the molded 11 dB linear equalizer at various frequencies are stated below in Table 18:

TABLE 18

| Frequency (MHz) | Input Return Loss (dB) | Output Return Loss (dB) |
| --- | --- | --- |
| 45 | −36.018 | −36.551 |
| 200 | −30.637 | −31.203 |
| 600 | −30.053 | −37.614 |
| 870 | −19.916 | −29.293 |

As shown in FIGS. 12B, 12C, 13B, 13C, 14B, and 14C for the exemplary 6, 7, and 11 dB linear equalizers, the input and output return losses are better for the molded equalizers as compared to the un-molded equalizers of the same dB value. The input and output return losses of the molded equalizers have the desired operating characteristics for use in amplifiers in CATV equipment, optic nodes, and other communications equipment, while the un-molded 6, 7, and 11 dB linear equalizers of FIGS. 12–14 do not have the desired operating characteristics. To obtain the desired operating characteristics, the present invention accounts for adding an injection-molded housing in designing an equalizer circuit of an un-molded equalizer, as further explained above in the several paragraphs following the tables showing results for the embodiments of non-linear molded equalizers shown in FIGS. 6–8.

Figure 15A:
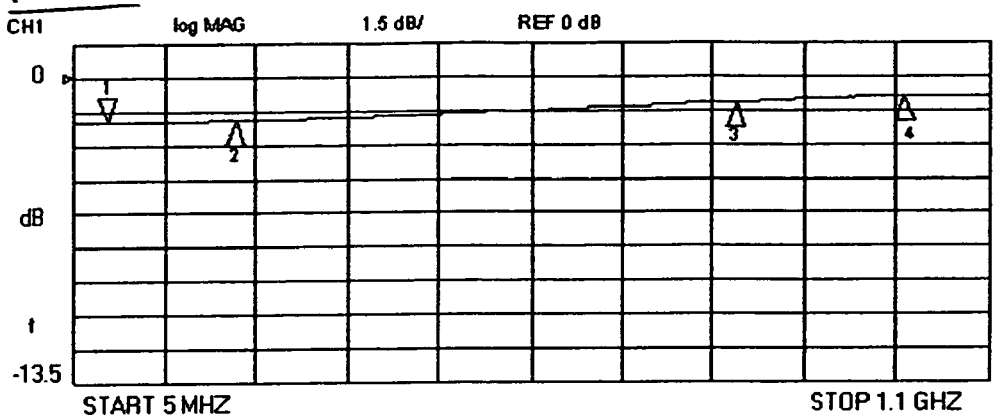
FIG. 15A illustrates frequency (MHz) versus insertion loss (dB) for an exemplary 2 dB linear equalizer.

FIGS. 15A–17C depict a sweep in frequency (in MHz) versus loss (in dB) for three different exemplary linear equalizer values. On the frequency axis (x-axis), the scale is linear from 5 to 1100 MHz (or 1.1 GHz), which is a portion of the bandwidth used in the CATV industry. On the loss axis (y-axis), the scale is −45 to 0 dB for figures showing input and output return loss (FIGS. 15B, 15C, 16B, 16C, 17B, and 17C). For insertion loss, the scale runs from −13.5 to 0 dB (FIGS. 15A, 16A, and 17A).

Figure 16A:
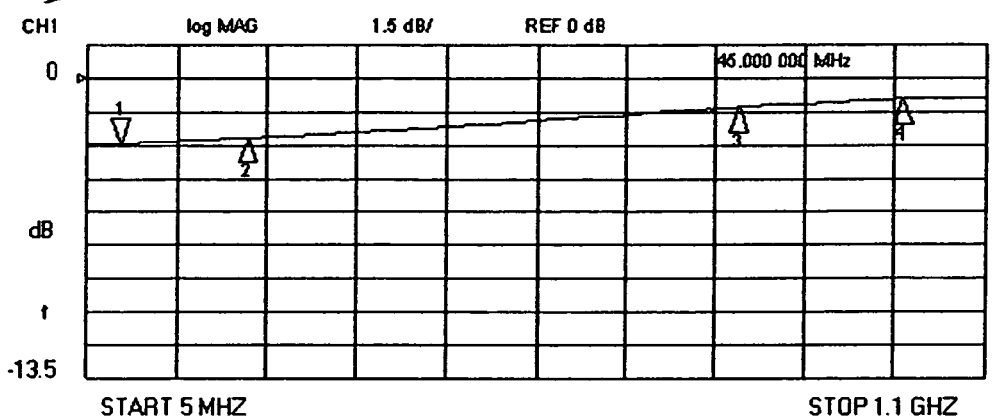
FIG. 16A illustrates frequency (MHz) versus insertion loss (dB) for an exemplary 3 dB linear equalizer.
Figure 17A:
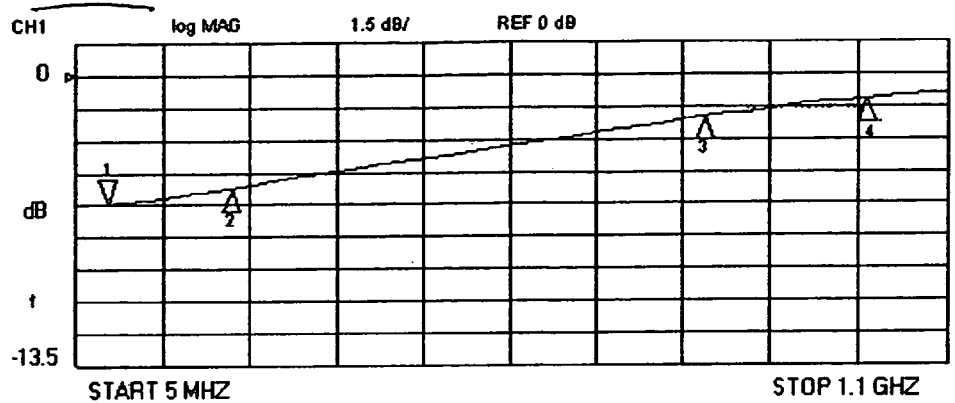
FIG. 17A illustrates frequency (MHz) versus insertion loss (dB) for an exemplary 6 dB linear equalizer.

Insertion loss is approximately the same whether the equalizer is molded or un-molded. A linear equalizer's assigned value (2 dB, 6 dB, 8 dB, 12 dB, 20 dB, etc.) is based on the approximate insertion loss of the equalizer at low frequencies. For illustration purposes, insertion loss graphs for exemplary 2 dB, 3 dB, and 6 dB linear equalizers are shown in FIGS. 15A, 16A, and 17A. These exemplary equalizers flatten a linear signal and are have a footprint in accordance with the embodiment shown in FIG. 18. Moreover, these exemplary equalizers have predetermined operating characteristics that remain substantially stable at frequencies as high as 1 to 1.2 GHz and possibly above.

In contrast to insertion loss, return loss of a molded equalizer varies from that of an un-molded equalizer of the same dB value. For each FIGS. 15B, 15C, 16B, 16C, 17B, and 17C, the return loss for an un-molded equalizer is shown by the top line of each graph, while the return loss for a molded equalizer is shown by the bottom line with the trace arrows. Although the lines may cross in these or other embodiments described herein, the line with trace arrows is always indicating the molded equalizer. The value of return loss is measured at four different frequencies (45, 200, 800, and 1000 MHz) within the spectrum used in the CATV industry and those values are reproduced in the tables below for the exemplary molded linear equalizers.

FIG. 15A shows insertion loss as a function of frequency for an exemplary 2 dB linear equalizer. The measured insertion loss for various frequencies is stated below in Table 19:

TABLE 19

| Frequency (MHz) | Insertion Loss (dB) |
| --- | --- |
| 45 | −1.9852 |
| 200 | −1.8839 |
| 800 | −1.1382 |
| 1000 | −0.8749 |

FIG. 16A shows insertion loss as a function of frequency for an exemplary 3 dB equalizer. The measured insertion loss for various frequencies is stated below in Table 20:

TABLE 20

| Frequency (MHz) | Insertion Loss (dB) |
|---|---|
| 45 | −2.9111 |
| 200 | −2.6456 |
| 800 | −1.2697 |
| 1000 | −0.9107 |

FIG. 17A shows insertion loss as a function of frequency for an exemplary 6 dB equalizer. The measured insertion loss for various frequencies is stated below in Table 21:

TABLE 21

| Frequency (MHz) | Insertion Loss (dB) |
|---|---|
| 45 | −5.91001 |
| 200 | −5.2124 |
| 800 | −1.9184 |
| 1000 | −1.1388 |

Figure 15B:
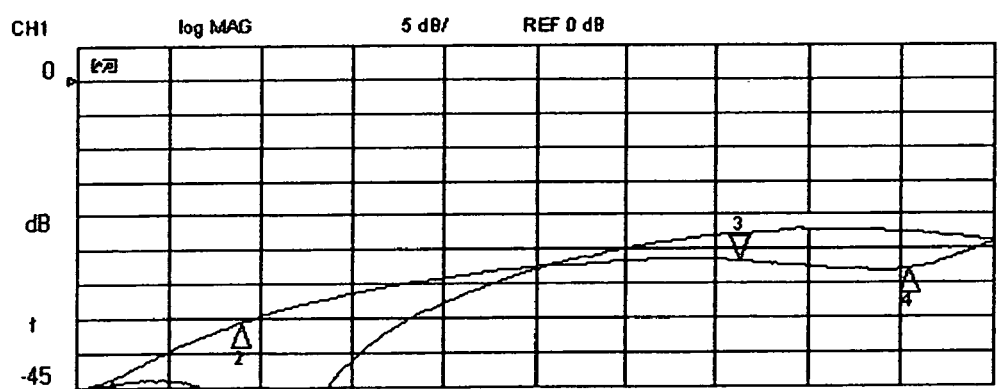
FIG. 15B shows frequency (MHz) versus input return loss (dB) for both un-molded and molded exemplary 2 dB linear equalizers.
Figure 15C:
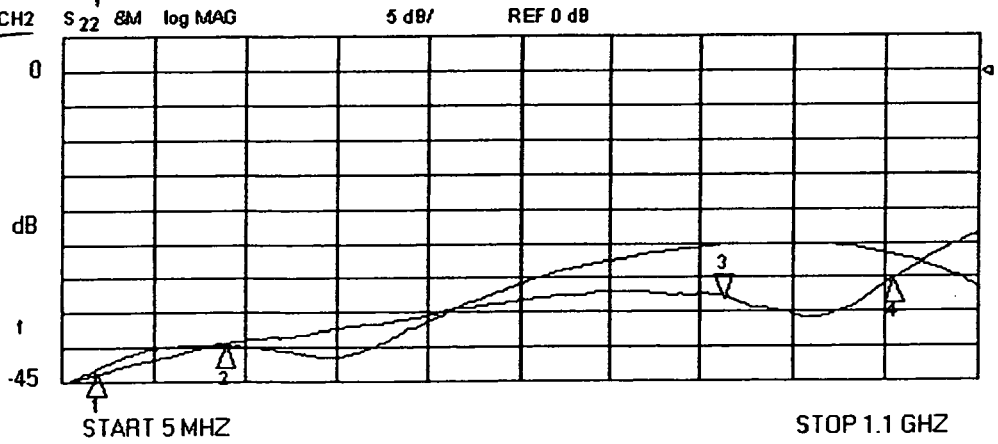
FIG. 15C shows frequency (MHz) versus output return loss (dB) for both un-molded and molded exemplary 2 dB linear equalizers.

FIG. 15B shows input return loss as a function of frequency for a 2 dB equalizer. FIG. 15C shows output return loss as a function of frequency for a 2 dB equalizer. Measured input return loss and output return loss for the 2 dB molded linear equalizer at various frequencies are stated below in Table 22:

TABLE 22

| Frequency (MHz) | Input Return Loss (dB) | Output Return Loss (dB) |
|---|---|---|
| 45 | −43.423 | −43.467 |
| 200 | −35.125 | −38.904 |
| 800 | −26.964 | −32.522 |
| 1000 | −28.397 | −29.608 |

Figure 16B:
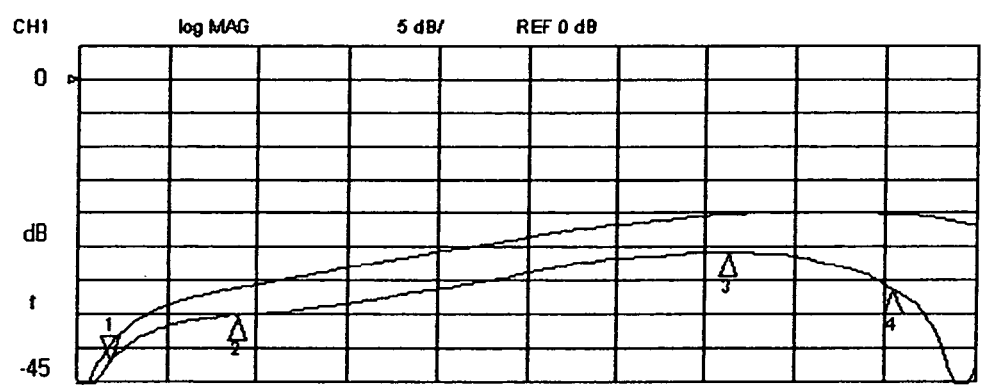
FIG. 16B shows frequency (MHz) versus input return loss (dB) for both un-molded and molded exemplary 3 dB linear equalizers.
Figure 16C:
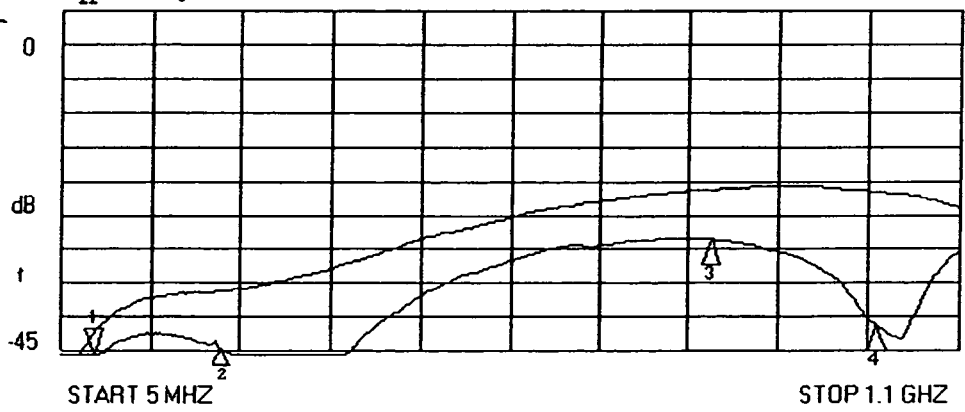
FIG. 16C shows frequency (MHz) versus output return loss (dB) for both un-molded and molded exemplary 3 dB linear equalizers.

FIG. 16B shows input return loss as a function of frequency for a 3 dB equalizer. FIG. 16C shows output return loss as a function of frequency for a 3 dB equalizer. Measured input return loss and output return loss for the molded 3 dB linear equalizer at various frequencies are stated below in Table 23:

TABLE 23

| Frequency (MHz) | Input Return Loss (dB) | Output Return Loss (dB) |
|---|---|---|
| 45 | −42.299 | −46.494 |
| 200 | −35.204 | −44.408 |
| 800 | −25.919 | −28.029 |
| 1000 | −30.954 | −40.683 |

Figure 17B:
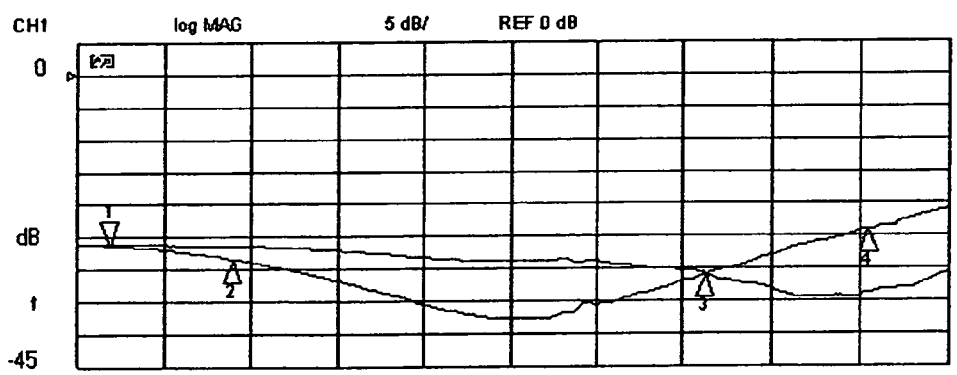
FIG. 17B shows frequency (MHz) versus input return loss (dB) for both un-molded and molded exemplary 6 dB linear equalizers.
Figure 17C:
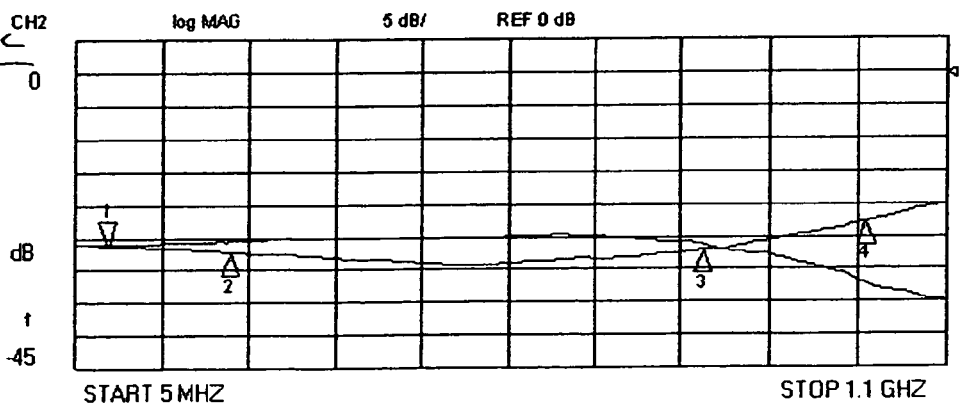
FIG. 17C shows frequency (MHz) versus output return loss (dB) for both un-molded and molded exemplary 6 dB linear equalizers.

FIG. 17B shows input return loss as a function of frequency for a 6 dB equalizer. FIG. 17C shows output return loss as a function of frequency for a 6 dB equalizer. Measured input return loss and output return loss for the molded 6 dB linear equalizer at various frequencies are stated below in Table 24:

TABLE 24

| Frequency (MHz) | Input Return Loss (dB) | Output Return Loss (dB) |
|---|---|---|
| 45 | −26.234 | −26.236 |
| 200 | −28.273 | −27.148 |
| 800 | −31.421 | −27.038 |
| 1000 | −24.263 | −22.816 |

As shown in FIGS. 15B, 15C, 16B, 16C, 17B, and 17C for the exemplary 2, 3, and 6 dB linear equalizers, the input and output return losses are better for the molded equalizers as compared to the un-molded equalizers of the same dB value. The input and output return losses of the molded equalizers have the desired operating characteristics for use in amplifiers in CATV equipment, optic nodes, and other communications equipment, while the un-molded 2, 3, and 6 dB linear equalizers of FIGS. 15–17 do not have the desired operating characteristics. To obtain the desired operating characteristics, the present invention accounts for adding an injection-molded housing in designing an equalizer circuit of an un-molded equalizer, as further explained above in the several paragraphs following the tables showing results for the embodiments of non-linear molded equalizers shown in FIGS. 6–8.

The foregoing description of the exemplary embodiments of the invention has been presented only for the purposes of illustration and description and is not intended to be exhaustive or to limit the invention to the precise forms disclosed. Many modifications and variations are possible in light of the above teaching. For example, it should be understood that certain embodiments of the invention are not limited to the number of pins, pin spacing, size, characteristic impedance, or frequency ranges of the exemplary embodiments described herein. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An equalizer, adapted for interface with a predetermined location in communications equipment, for equalizing a signal flowing through the communications equipment, comprising:
 a first circuit comprising at least one resistor, at least one inductor, and at least one capacitor;
 a housing comprising a material that is formed about the first circuit to encapsulate the circuit so that the combination of the circuit and material forms a second circuit having predetermined operating characteristics; and
 a plurality of pins coupled to the circuit and protruding from the housing so as to interface with the predetermined location.

2. The equalizer of claim 1, wherein the predetermined operating characteristics include an input and output return loss of at least approximately −18 dB.

3. The equalizer of claim 1, wherein the predetermined operating characteristics are selected from a group consisting of (a) a characteristic impedance of approximately 50–75 ohms, (b) an output return loss ranging from about 18 to about 45 db over a frequency range of up to about 1.1 GHz, (c) an input return loss ranging from about 18 to about 45 db over a frequency range of up to about 1.1 GHz, and (d) an insertion loss ranging from about 0.65 dB to about 1.3 db over a frequency range of about 700 MHz to about 1.1 GHz.

4. The equalizer of claim 1, wherein the material is polypropylene.

5. The equalizer of claim 1, wherein the signal flowing through the communications equipment is a linear signal.

6. The equalizer of claim 1, wherein the signal flowing through the communications equipment is a curved signal.

7. The equalizer of claim 1, wherein the housing is marked with indicia to indicate an operating characteristic.

8. The equalizer of claim 1, wherein the predetermined operating characteristics remain substantially stable over a frequency range of up to about 1.2 GHz.

9. A method of making a robust, single piece and passive electronic component, the method comprising:

designing a passive circuit with a first set of operating characteristics, the circuit comprising at least one resistor, at least one inductors and at least one capacitor; and molding a non-conducting material around the circuit and at least a portion of a substrate to create a housing that encapsulates the circuit and changes the performance of the circuit to create a second set of operating characteristics.

10. The method of claim 9, wherein the circuit is an equalizer, the molding is injection molding and further comprising determining, before the injection molding, whether the equalizer provides an input and output return loss less than approximately −18 dB.

11. An electronic component made according to the method of claim 9.

12. The method of claim 10, further comprising determining, after molding, whether the equalizer provides an input and output return loss of at least approximately −18 dB.

* * * * *